US00RE40264E

(19) United States
(12) Reissued Patent
Flamm

(10) Patent Number: US RE40,264 E
(45) Date of Reissued Patent: Apr. 29, 2008

(54) MULTI-TEMPERATURE PROCESSING

(76) Inventor: Daniel L. Flamm, 476 Green View Dr., Walnut Creek, CA (US) 94596

(21) Appl. No.: 10/439,245

(22) Filed: May 14, 2003

Related U.S. Patent Documents

Reissue of:
(64) Patent No.: 6,231,776
Issued: May 15, 2001
Appl. No.: 09/151,163
Filed: Sep. 10, 1998

U.S. Applications:
(63) Continuation-in-part of application No. 08/567,224, filed on Dec. 4, 1995, now abandoned.
(60) Provisional application No. 60/058,650, filed on Sep. 11, 1997.

(51) Int. Cl.
*H05H 1/00* (2006.01)
*H01L 21/302* (2006.01)

(52) U.S. Cl. ..... 216/59; 216/67; 216/68; 216/74; 438/714; 438/715; 204/192.32; 156/345.52; 156/345.53

(58) Field of Classification Search ..... 438/715, 438/719, 721, 725, 737, 738; 216/41, 49, 216/63–67, 75, 79; 156/345.27, 345.52, 345.53
See application file for complete search history.

(56) References Cited

U.S. PATENT DOCUMENTS

| | | | | | |
|---|---|---|---|---|---|
| 5,179,264 | A | | 1/1993 | Cuomo et al. | 219/121.43 |
| 5,294,778 | A | | 3/1994 | Carman et al. | 219/385 |
| 5,320,982 | A | * | 6/1994 | Tsubone et al. | 428/714 |
| 5,556,204 | A | * | 9/1996 | Tamura et al. | 374/161 |
| 5,571,366 | A | | 11/1996 | Ishii | 156/345 |
| 5,609,720 | A | * | 3/1997 | Lenz et al. | 438/715 |
| 5,645,683 | A | | 7/1997 | Miyamoto | 156/643.1 |
| 5,667,631 | A | | 9/1997 | Holland et al. | 216/13 |
| 5,695,564 | A | | 12/1997 | Imahashi | 118/719 |
| 5,700,734 | A | | 12/1997 | Ooishi | 438/592 |
| 5,705,433 | A | * | 1/1998 | Olson et al. | 438/695 |
| 5,756,401 | A | | 5/1998 | Iizuka | 438/719 |
| 5,770,099 | A | | 6/1998 | Rice et al. | 216/68 |
| 5,863,376 | A | | 1/1999 | Wicker et al. | 156/345 |
| 5,925,212 | A | | 7/1999 | Rice et al. | 156/345 |
| 5,939,831 | A | | 8/1999 | Fong et al. | 315/111.21 |
| 5,948,283 | A | | 9/1999 | Grosshart | 216/67 |
| 5,965,034 | A | * | 10/1999 | Vinogradov et al. | 216/68 |
| 6,008,139 | A | | 12/1999 | Pan et al. | 438/730 |
| 6,033,478 | A | | 3/2000 | Kholodenko | 118/500 |
| 6,042,901 | A | | 3/2000 | Denison et al. | 427/579 |
| 6,048,798 | A | | 4/2000 | Gadgil et al. | 438/714 |
| 6,068,784 | A | | 5/2000 | Collins et al. | 216/68 |
| 6,077,357 | A | * | 6/2000 | Rossman et al. | 118/728 |
| 6,087,264 | A | * | 7/2000 | Shin et al. | 438/706 |
| 6,090,303 | A | | 7/2000 | Collins et al. | 216/68 |
| 6,140,612 | A | | 10/2000 | Husain et al. | 219/390 |
| 6,165,311 | A | | 12/2000 | Collins et al. | 156/345 |
| 6,167,834 | B1 | | 1/2001 | Wang et al. | 418/723 |
| 6,391,148 | B2 | | 5/2002 | Marks et al. | |
| 6,486,069 | B1 | | 11/2002 | Marks et al. | |
| 2001/0003676 | A1 | | 6/2001 | Marks et al. | |

FOREIGN PATENT DOCUMENTS

| | | | | |
|---|---|---|---|---|
| EP | 1236226 | A2 | | 7/2001 |
| JP | 59076876 | A | * | 5/1984 |
| WO | WO-01/41189 | A2 | | 7/2001 |

* cited by examiner

*Primary Examiner*—Anita Alanko
(74) *Attorney, Agent, or Firm*—Daniel L. Flamm

(57) ABSTRACT

The present invention provides a technique, including a method and apparatus, for etching a substrate in the manufacture of a device. The apparatus includes a chamber and a substrate holder disposed in the chamber. The substrate holder has a selected thermal mass to facilitate changing the temperature of the substrate to be etched during etching processes. That is, the selected thermal mass of the substrate holder allows for a change from a first temperature to a second temperature within a characteristic time period to process a film. The present technique can, for example, provide different processing temperatures during an etching process or the like.

59 Claims, 15 Drawing Sheets

A. $SF_6$ native oxide "breakthrough"
B. $Cl_2$ plasma is ignited
C. $WSi_x$ begins to clear (endpoint)
D. Polysilicon is exposed
E. Polysilicon cleared to oxide
H. Plasma extinguished and O2 feed gas flow is started
I. $O_2$ plasma is started
J $O_2$ plasma is extinguished.

MULTI-TEMPERATURE PROCESSING

Matter enclosed in heavy brackets [ ] appears in the original patent but forms no part of this reissue specification; matter printed in italics indicates the additions made by reissue.

CROSS-REFERENCE TO RELATED APPLICATIONS

This present application is a continuation-in-part of U.S. application Ser. No. 60/058,650 filed Sep. 11, 1997, and a continuation-in-part of U.S. application Ser. No. 08/567,224 filed Dec. 4, 1995, now abandoned which are hereby incorporated by reference for all purposes.

BACKGROUND OF THE INVENTION

This invention relates generally to plasma processing. More particularly, one aspect of the invention is for greatly improved plasma processing of devices using an in-situ temperature application technique. Another aspect of the invention is illustrated in an example with regard to plasma etching or resist stripping used in the manufacture of semiconductor devices. The invention is also of benefit in plasma assisted chemical vapor deposition (CVD) for the manufacture of semiconductor devices. But it will be recognized that the invention has a wider range of applicability. Merely by way of example, the invention also can be applied in other plasma etching applications, and deposition of materials such as silicon, silicon dioxide, silicon nitride, polysilicon, among others.

Plasma processing techniques can occur in a variety of semiconductor manufacturing processes. Examples of plasma processing techniques occur in chemical dry etching (CDE), ion-assisted etching (IAE), and plasma enhanced chemical vapor deposition (PECVD), including remote plasma deposition (RPCVD) and ion-assisted plasma enhanced chemical vapor deposition (IAPECVD). These plasma processing techniques often rely upon radio frequency power (rf) supplied to an inductive coil for providing power to produce with the aid of a plasma.

Plasmas can be used to form neutral species (i.e., uncharged) for purposes of removing or forming films in the manufacture of integrated circuit devices. For instance, chemical dry etching is a technique which generally depends on gas-surface reactions involving these neutral species without substantial ion bombardment.

In a number of manufacturing processes, ion bombardment to substrate surfaces is often undesirable. This ion bombardment, however, is known to have harmful effects on properties of material layers in devices and excessive ion bombardment flux and energy can lead to intermixing of materials in adjacent device layers, breaking down oxide and "wear out," injecting of contaminative material formed in the processing environment into substrate material layers, harmful changes in substrate morphology (e.g. amophotization), etc.

Ion assisted etching processes, however, rely upon ion bombardment to the substrate surface in defining selected films. But these ion assisted etching processes commonly have a lower selectivity relative to conventional CDE processes. Hence, CDE is often chosen when high selectivity is desired and ion bombardment to substrates is to be avoided.

In generally most, if not all, of the above processes maintain temperature in a "batch" mode. That is, the temperature of surfaces in a chamber and of the substrate being processed in such chamber are controlled to be at a substantially a single value of temperature during processing.

From the above it is seen that an improved technique, including a method and apparatus, for plasma processing is often desired.

SUMMARY OF THE INVENTION

The present invention provides a technique, including a method and apparatus, for fabricating a product using a plasma discharge. One aspect of the present technique relies upon multi-stage etching processes for selectively removing a film on a workpiece using differing temperatures. It overcomes serious disadvantages of prior art methods in which throughput and etching rate were lowered in order to avoid excessive device damage to a workpiece. In particular, this technique is extremely beneficial for removing resist masks which have been used to effect selective ion implantation of a substrate in some embodiments. In general, implantation of ions into a resist masking surface causes the upper surface of said resist to become extremely cross-linked and contaminated by materials from the ion bombardment. If the cross-linked layer is exposed to excessive temperature, it is prone to rupture and forms contaminative particulate matter. Hence, the entire resist layer is often processed at a low temperature to avoid this particle problem. Processing at a lower temperature often requires excessive time which lowers throughput. Accordingly, the present invention overcomes these disadvantages of conventional processes by rapidly removing a majority of resist at a higher temperature after an ion implanted layer is removed without substantial particle generation at a lower temperature.

In another aspect, the present invention provides a process which utilizes temperature changes to achieve high etch rates while simultaneously maintaining high etch selectivity between a layer which is being pattered or removed other material layers. An embodiment of this process advantageously employs a sequence of temperature changes as an unexpected means to avoid various types of processing damage to the a device and material layers. A novel inventive means for effecting a suitable controlled change in temperature as part of a process involves the use of a workpiece support which has low thermal mass in comparison to the heat transfer means. In an aspect of this invention, a fluid is utilized to change the temperature of a workpiece. In another aspect, the thermal capacity of a circulating fluid is sufficiently greater than the thermal capacity of the workpiece support that it permits maintaining the workpiece at a substantially uniform temperature.

Still another aspect of the invention provides an apparatus for etching a substrate in the manufacture of a device using different temperatures during etching. The apparatus includes a chamber and a substrate holder disposed in the chamber. The substrate holder has a selected thermal mass to facilitate changing the temperature of the substrate to be etched. That is, the selected thermal mass of the substrate holder allows for a change from a first temperature to a second temperature within a characteristic time period to process a film. The present apparatus can, for example, provide different processing temperatures during an etching process or the like.

The present invention achieves these benefits in the context of known process technology. However, a further understanding of the nature and advantages of the present invention may be realized by reference to the latter portions of the specification and attached drawings.

DETAILED DESCRIPTION OF THE INVENTION

Figure 1:
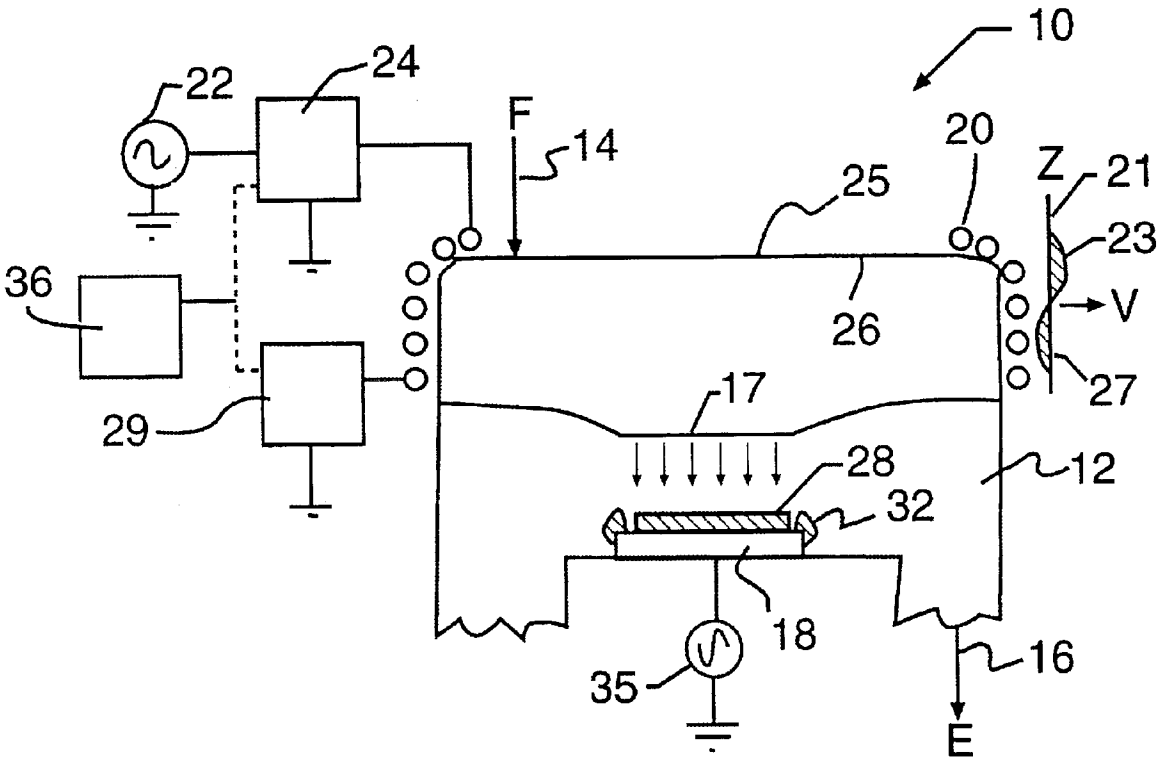
FIG. 1 is a simplified diagram of a plasma etching apparatus according to the present invention.

FIG. 1 is a simplified diagram of a plasma etch apparatus 10 according to the present invention. This etch apparatus is provided with an inductive applicator, e.g., inductive coil. This etch apparatus depicted, however, is merely an illustration, and should not limit the scope of the claims as defined herein. One of ordinary skilled in the art may implement the present invention with other treatment chambers and the like.

The etch apparatus includes a chamber 12, a feed source 14, an exhaust 16, a product support check or pedestal 18, an inductive applicator 20, a radio frequency ("rf") power source 22 to the inductive applicator 20, wave adjustment circuits 24, 29 (WACs), a radio frequency power source 35 to the pedestal 18, a controller 36, an agile temperature control means [19], and other elements. Optionally, the etch apparatus includes a gas distributor 17.

The chamber 12 can be any suitable chamber capable of housing a product 28, such as a wafer to be etched, and for providing a plasma discharge therein. The chamber can be a domed chamber for providing a uniform plasma distribution over the product 28 to be etched, but the chamber also can be configured in other shapes or geometries, e.g., flat ceiling, truncated pyramid, cylindrical, rectangular, etc. Depending upon the application, the chamber is selected to produce a uniform entity density over the pedestal 18, providing a high density of entities (i.e., etchant species) for etching uniformity.

The product support chuck can rapidly change its temperature in ways defined herein as well as others. The wafer is often thermally coupled to the support check which permits maintaining the wafer temperature in a known relationship with respect to the chuck. Coupling will often comprise an electrostatic chuck or mechanical clamps, which apply a pressure to bring the product into close proximity with the support check, which enables a relatively good thermal contact between the wafer and support chuck. The support chuck and wafer are often maintained at a substantially equal temperature. A pressure of gas is often applied through small openings in the support chuck behind the wafer in order to improve thermal contact and heat transfer between the wafer and support chuck.

The present chamber includes a dome 25 having an interior surface 26 made of quartz or other suitable materials. The exterior surface of the chamber is typically a dielectric material such as a ceramic or the like. Chamber 12 also includes a process kit with a focus ring 32, a cover (not shown), and other elements. Preferably, the plasma discharge is derived from the inductively coupled plasma source that is a de-coupled plasma source ("DPS") or a helical resonator, although other sources can be employed.

The de-coupled source originates from rf power derived from the inductive applicator 20. Inductively coupled power is derived from the power source 22. The rf signal frequencies ranging from 800 kHz to 80 MHz can be provided to the inductive applicator 20. Preferably, the rf signal frequencies range from 5 MHz to 60 MHz. The inductive applicator (e.g., coil, antenna, transmission line, etc.) overlying the chamber ceiling can be made using a variety of shapes and ranges of shapes. For example, the inductive applicator can be a single integral conductive film, a transmission line, or multiple coil windings. The shape of the inductive applicator and its location relative to the chamber are selected to provide a plasma overlying the pedestal to improve etch uniformity.

The plasma discharge (or plasma source) is derived from the inductive applicator 20 operating with selected phase 23 and anti-phase 27 potentials (i.e., voltages) that substantially cancel each other. The controller 36 is operably coupled to the wave adjustment circuits 24, 29. In one embodiment, wave adjustment circuits 24, 29 provide an inductive applicator operating at full-wave multiples 21. This embodiment of full-wave multiple operation provides for balanced capacitance of phase 23 and anti-phase voltages 27 along the inductive applicator (or coil adjacent to the plasma). This full-wave multiple operation reduces or substantially eliminates the amount of capacitively coupled power from the plasma source to chamber bodies (e.g., pedestal, walls, wafer, etc.) at or close to ground potential. Alternatively, the wave adjustment circuits 24, 29 provide an inductive applicator that is effectively made shorter or longer than a full-wave length multiple by a selected amount, thereby operating at selected phase and anti-phase voltages that are not full-wave multiples. Alternatively, more than two, one or even no wave adjustment circuits can be provided in other embodiments. But in all of these above embodiments, the phase and anti-phase potentials substantially cancel each other, thereby providing substantially no capacitively coupled power from the plasma source to the chamber bodies.

In alternative embodiments, the wave adjustment circuit can be configured to provide selected phase and anti-phase coupled voltages coupled from the inductive applicator to the plasma that do not cancel. This provides a controlled potential between the plasma and the chamber bodies, e.g., the substrate, grounded surfaces, walls, etc. In one embodiment, the wave adjustment circuits can be used to selectively reduce current (i.e., capacitively coupled current) to the plasma. This can occur when certain high potential difference regions of the inductive applicator to the plasma are positioned (or kept) away from the plasma region (or inductor-containing-the-plasma region) by making them go into the wafer adjustment circuit assemblies, which are typically configured outside of the plasma region. In this embodiment, capacitive current is reduced and a selected degree of symmetry between the phase and anti-phase of the coupled voltages is maintained, thereby provided a selected potential or even substantially ground potential. In other embodiments, the wave adjustment circuits can be used to selectively increase current (i.e., capacitively coupled current) to the plasma.

As shown, the wave adjustment circuits are attached (e.g., connected, coupled, etc.) to ends of the inductive applicator. Alternatively, each of these wave adjustment circuits can be attached at an intermediate position away from the inductive application ends. Accordingly, upper and lower tap positions for respective wave adjustment circuits can be adjustable. But both the inductive applicator portions below and above each tap position are active. That is, they both can interact with the plasma discharge.

A sensing apparatus can be used to sense plasma voltage which is used to provide automatic turning of the wave adjustment circuits and any rf matching circuit between the rf generator and the plasma treatment chamber. This sensing apparatus can maintain the average AC potential at zero or a selected value relative to ground or any other reference value. This wave adjustment circuit provides for a selected potential difference between the plasma source and chamber bodies. These chamber bodies may be at a ground potential or a potential supplied by another bias supply, e.g., See FIG. 1 reference numeral 35. Examples of wave adjustment circuits are described by way of the FIGS. below.

For instance, FIGS. 2A to 2E are simplified configurations using the wave adjustment circuits according to the present invention. These simplified configurations should not limit the scope of the claims herein. In an embodiment, these wave adjustment circuits employ substantially equal circuit elements (e.g., inductors, capacitors, transmission line sections, and others) such that the electrical length of the wave adjustment circuits in series with the inductive applicator coupling power to the plasma is substantially an integral multiple of one wavelength. In other embodiments, the circuit elements provide for inductive applicators at other wavelength multiples, e.g., one-sixteenth-wave, one-eighth-wave, quarter-wave, half-wave, three-quarter wave, etc. In these embodiments (e.g., full-wave multiple, half-wave, quarter-wave, etc.), the phase and anti-phase relationship between the plasma potentials substantially cancel each other. In further embodiments, the wave adjustment circuits employ circuit elements that provide plasma applicators with phase and anti-phase potential relationships that do not cancel each other out using a variety of wave length portions.

Figure 2A:
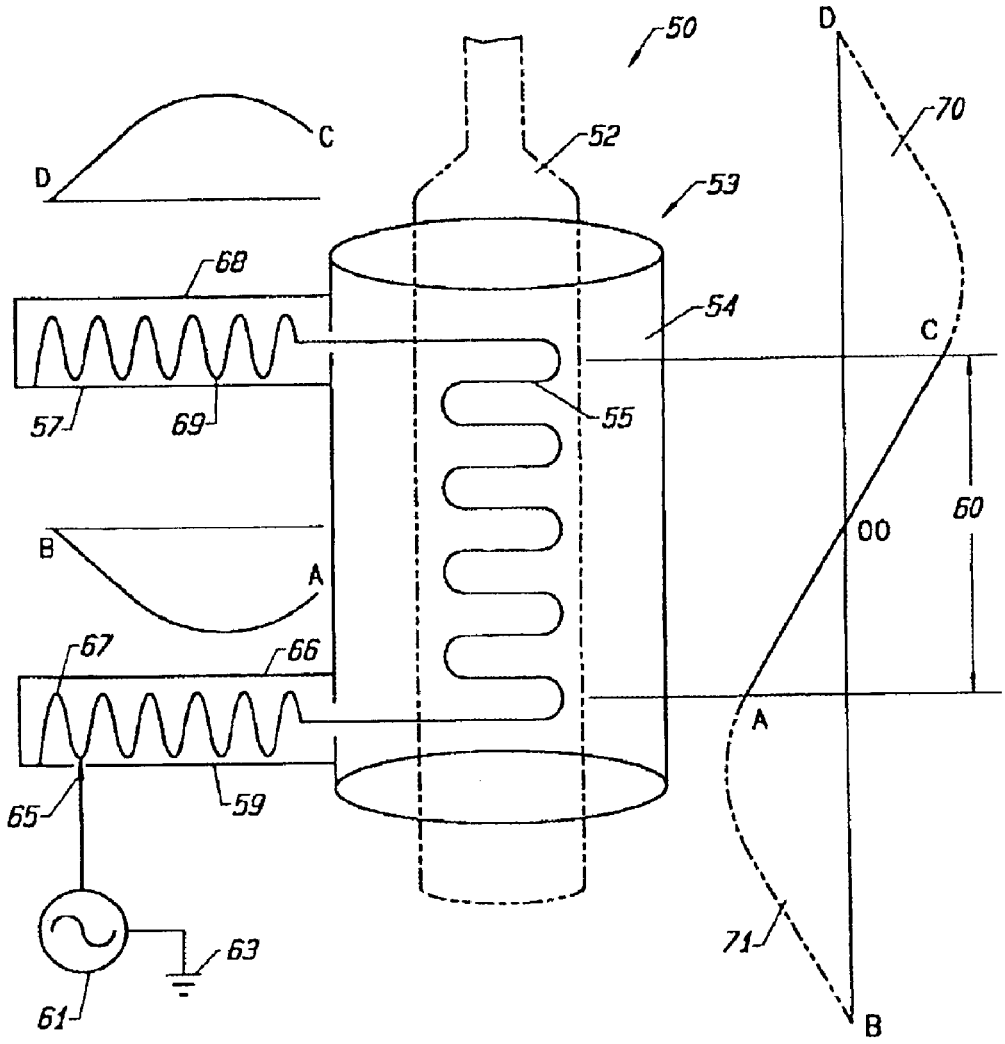
FIGS. 2A–2E are simplified configurations using wave adjustment circuits according to the present invention.

FIG. 2A is a simplified illustration of a plasma source 50 using wave adjustment circuits and an agile temperature chuck 75 according to an embodiment of the present invention. This plasma source 50 includes a discharge tube 52, an inductive applicator 55, an exterior shield 54, an upper wave adjustment circuit 57, a lower wave adjustment circuit 59, an rf power supply 61, and other elements. The upper wave adjustment circuit 57 is a helical coil transmission line portion 69, outside of the plasma source region 60. Lower wave adjustment circuit 59 also is a helical coil transmission line portion 67 outside of the plasma source region 60. The power supply 61 is attached 65 to this lower helical coil portion 67, and is grounded 63. Each of the wave adjustment circuits also are shielded 66, 68.

In this embodiment, the wave adjustment circuits are adjusted to provide substantially zero AC voltage at one point on the inductive coil (refer to point 00 in FIG. 2A). This embodiment also provides substantially equal phase 70 and anti-phase 71 voltage distributions in directions about this point (refer to 00-A and 00-C in FIG. 2A) and provides substantially equal capacitance coupling to the plasma from physical inductor elements (00-C) and (00-A), carrying the phase and anti-phase potentials. Voltage distributions 00-A and 00-C are combined with C-D and A-B (shown by the phantom lines) to substantially comprise a full-wave voltage distribution in this embodiment where the desired configuration is a selected phase/anti-phase portion of a full-wave inductor (or helical resonator) surrounding the plasma source discharge tube.

In this embodiment, it is desirable to reduce or minimize capacitive coupling current from the inductive element to the plasma discharge in the plasma source. Since the capacitive current increases monotonically with the magnitude of the difference of peak phase and anti-phase voltages, which occur at points A and C in FIG. 2A, this coupling can be lessened by reducing this voltage difference. In FIG. 2A, for example, it is achieved by way of two wave adjustment circuits 57, 59. Coil 55 (or discharge source) is a helical resonator and the wave adjustment circuits 57, 59 are helical resonators.

The discharge source helical resonator 53 can be constructed using conventional design formulae. Generally, this helical resonator includes an electrical length which is a selected phase portion "x" (A to 00 to C) of a full-wave helical resonator. The helical resonator wave adjustment circuits are each selected to jointly comprise a portion ($2\pi$-x) of full-wave helical resonators. Physical parameters for the wave adjustment helical resonators can be selected to realize practical physical dimensions and appropriate Q, $Z_O$, etc values. In particular, some or even all of the transmission line parameters (Q, $Z_O$, etc.) of the wave adjustment circuit sections may be selected to be substantially the same as the transmission line parameters of the inductive applicator. The portion of the inductive plasma applicator helical resonator, on the other hand, is designed and sized to provide selected uniformity values over substrate dimensions within an economical equipment size and reduced Q.

The wave adjustment circuit provides for external rf power coupling, which can be used to control and match power to the plasma source, as compared to conventional techniques used in helical resonators and the like. In particular, conventional techniques often match to, couple power to, or match to the impedance of the power supply to the helical resonator by varying a tap position along the coil above the grounded position, or selecting a fixed tap position relative to a grounded coil end and matching to the impedance at this position using a conventional matching network, e.g., LC network, $\pi$ network, etc. Varying this tap position along the coil within a plasma source is often cumbersome and generally imposes difficult mechanical design problems. Using the fixed tap and external matching network also is cumbersome and can cause unanticipated changes in the discharge Q, and therefore influences its operating mode and stability. In the present embodiments, the wave adjustment circuits can be positioned outside of the plasma source (or constrained in space containing the inductive coil, e.g., See FIG. 2A. Accordingly, the mechanical design (e.g., means for varying tap position, change in the effective rf power coupling point by electrical means, etc.) of the tap position are simplified relative to those conventional techniques.

Figure 2B:
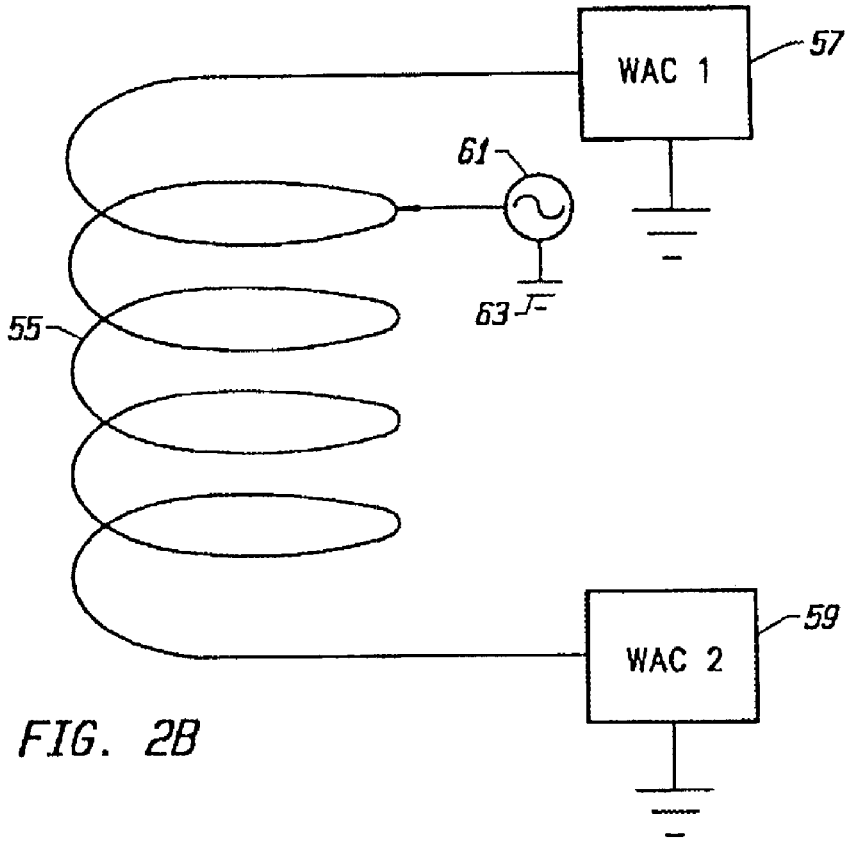
Figure 2C:
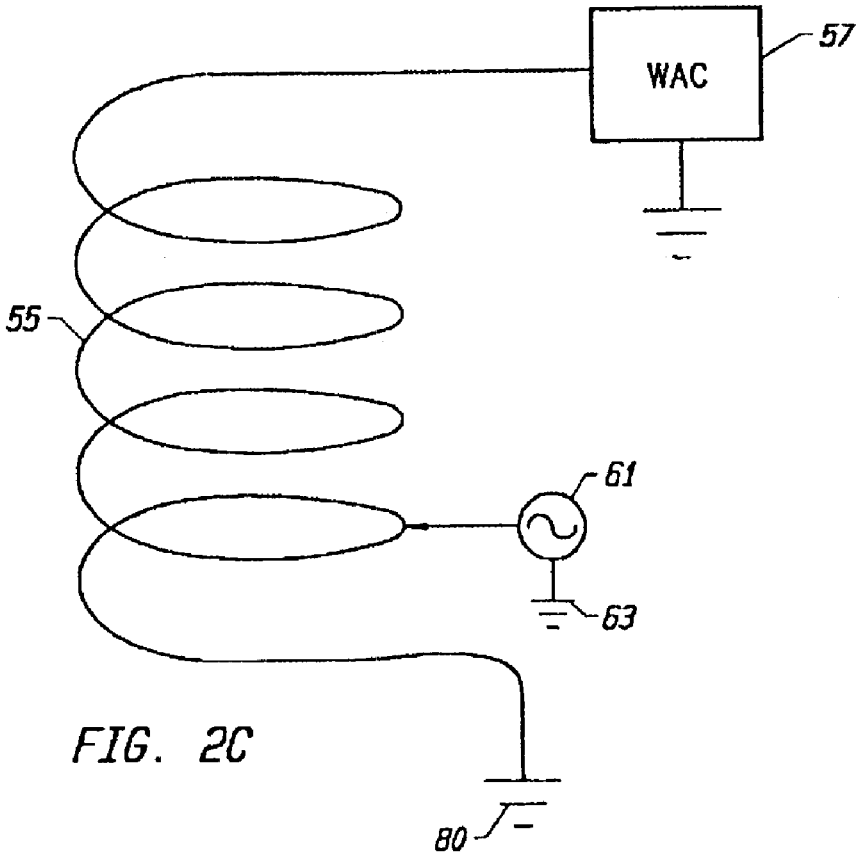

In the present embodiment, rf power is fed into the lower wave adjustment circuit 59. Alternatively, rf power can be fed into the upper wave adjustment circuit (not shown). The rf power also can be coupled directly into the inductive plasma coupling applicator (e.g., coil, etc.) in the wave adjustment circuit design, as illustrated by FIG. 2B. Alternatively, other applications will use a single wave adjustment circuit, as illustrated by FIG. 2C. Power can be coupled into this wave adjustment circuit or by conventional techniques such as a tap in the coil phase. In some embodiments, this tap in the coil phase is positioned above the grounded end. An external impedance matching network may then be operably coupled to the power for satisfactory power transfer efficiency from, for example, a conventional coaxial cable to impedances (current to voltage rations) existing between the wave adjustment circuit terminated end of the applicator and the grounded end.

Figure 2D:
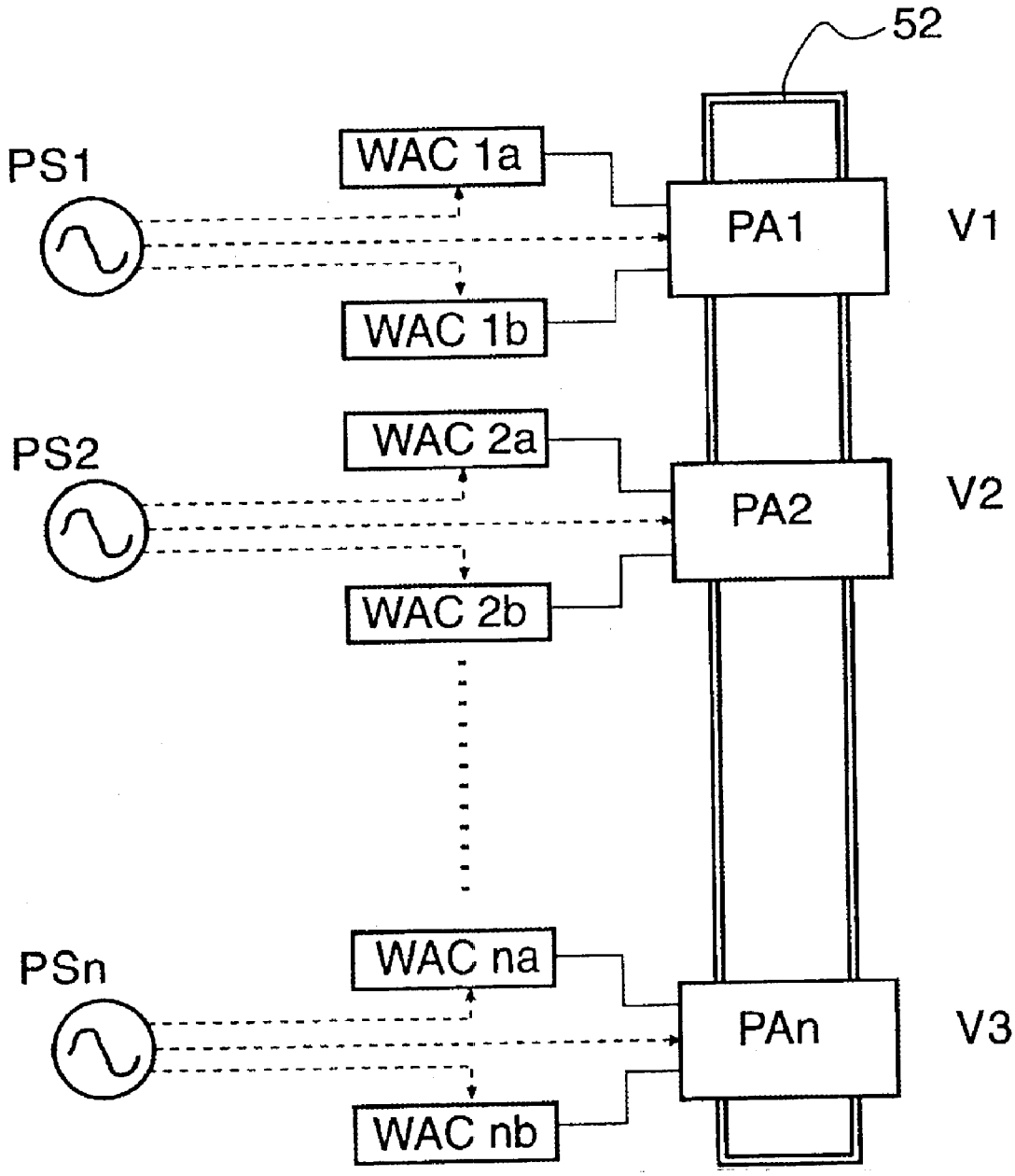

A further embodiment using multiple inductive plasma applicators also is provided, as shown in FIG. 2D. This embodiment includes multiple plasma applicators (PA 1, PA2. . . PAn). These plasma applicators respectively provide selected combinations of inductively coupled power and capacitively coupled power from respective voltage potentials (V1, V2. . . Vn). Each of these plasma applicators derives power from its power source (PS1, PS2. . . PSn) either directly through an appropriate matching or coupling network or by coupling to a wave adjustment circuit as described. Alternatively, a single power supply using power splitters and impedance matching networks can be coupled to each (or more than two) of the plasma applicators. Alternatively, more than one power supply can be used where at least one power supply is shared among more than one plasma applicator. Each power source is coupled to its respective wave adjustment circuits (WAC1, WAC2. . . WACn).

Generally, each plasma applicator has an upper wave adjustment circuit (e.g., WAC1a, WAC2a. . . WACna) and a lower wave adjustment circuit (e.g., WAC1b, WAC2b. . . WACnb). The combination of upper and lower wave adjustment circuits are used to adjust the plasma source potential for each plasma source zone. Alternatively, a single wave adjustment circuit can be used for each plasma applicator. Each wave adjustment circuit can provide substantially the same impedance characteristics, or substantially distinct impedance characteristics. Of course, the particular configuration used will depend upon the application.

For instance, multiple plasma applicators can be used to employ distinct excitation frequencies for selected zones in a variety of applications. These applications include film deposition using plasma enhanced chemical deposition, etching by way of ion enhanced etching or chemical dry etching and others. Plasma cleaning also can be performed by way of the multiple plasma applicators. Specifically, at least one of the plasma applicators will define a cleaning plasma used for cleaning purposes. In one embodiment, this cleaning plasma can have an oxygen containing species. This cleaning plasma is defined by using an oxygen discharge, which is sustained by microwave power to a cavity or resonant microwave chamber abutting or surrounding a conventional dielectric vessel. Of course, a variety of other processes also can be performed by way of this multiple plasma applicator embodiment.

This present application using multiple plasma applicators can provide a multi-zone (or multi-chamber) plasma source without the use of conventional mechanical separation means (e.g., baffles, separate process chambers, etc.). Alternatively, the degree of interaction between adjacent zones or chambers can be relaxed owing to the use of voltage potential control via wave adjustment circuits. This plasma source provides for multiple plasma source chambers, each with its own control via its own plasma applicator. Accordingly, each plasma applicator provides a physical zone region (i.e., plasma source) with selected plasma characteristics (e.g., capacitively coupled current, inductively coupled current, etc.). These zones can be used alone or can be combined with other zones. Of course, the particular configuration will depend upon the application.

In the present embodiments, the wave adjustment circuit can be made from any suitable combination of element(s) such as various types of transmission lines, circuits, etc. These transmission lines include conventional solid or air dielectric coaxial cable, or ordinary, repeating inductor/capacitor discrete approximations to transmission lines, and others. These types of transmission lines are co-axial transmission lines, balanced parallel transmission lines, so called slow wave transmission lines with a spiral inner conductor (e.g., selected portions of a helical resonator, etc.), and others. Individual lumped, fixed, or adjustable combinations of resistors, capacitors, and inductors (e.g., matching networks, etc.) also can be used in place of transmission line sections for the wave adjustment circuit. These general types of wave adjustment circuits are frequency dependent, and can be termed frequency dependent wave adjustment circuits (or FDWACs).

Frequency independent elements also can be used as the wave adjustment circuits. These wave adjustment circuits can be termed frequency independent WACs (or FIWACs). Frequency independent wave adjustment circuits include degenerate cases such as short-circuit connections to ground or an infinite impedance (i.e., open circuit), and others. Frequency independent wave adjustment circuits can be used alone, or in combination with the frequency dependent wave adjustment circuits. Alternatively, the frequency dependent wave adjustment circuits can be used alone or in combination with other wave adjustment circuits. Other variations, alternative constructions, and modifications also may be possible depending upon the application.

Figure 2E:
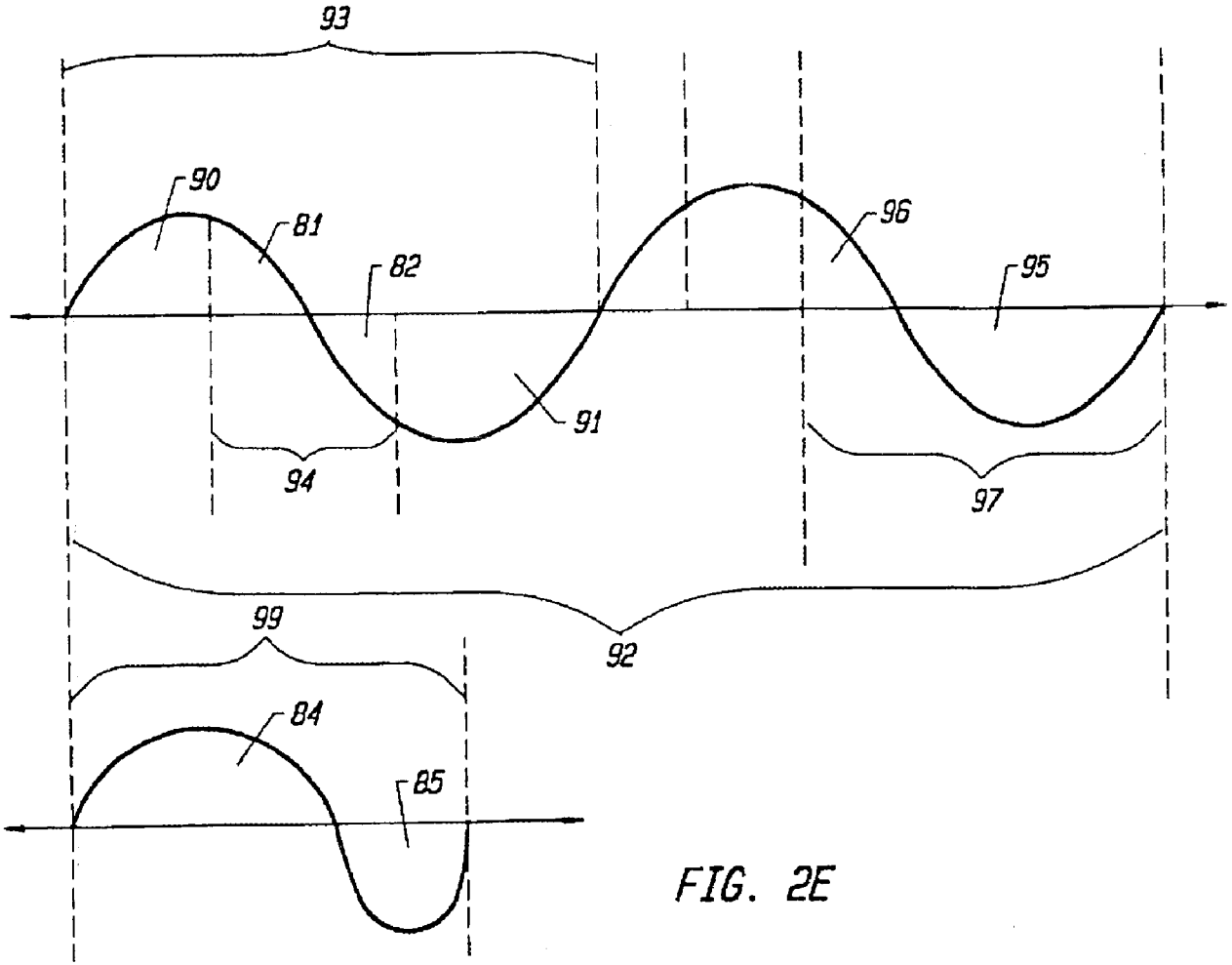

With regard to operation of the wave adjustment circuits, various embodiments can be used, as illustrated by FIG. 2E. The wave adjustment circuits are used to select a wave length portion to be applied in the plasma applicator. In some embodiments, the average rf plasma potential is maintained close to ground potential by providing substantially equal phase 90, 81 and anti-phase 91, 82 capacitively coupled portions of the inductive applicator. This can occur in multi-wave embodiments 92, full-wave embodiments 93, half-wave multiple embodiments, quarter-wave multiple embodiments, or any other embodiments 94.

In alternative embodiments, it is desirable to maintain an elevated source plasma voltage relative to ground potential to induce a controlled ion plasma flux (or ion bombardment) to the product substrate (or any other chamber bodies). These embodiments are provided by selecting distinct electrical lengths for each of the wave adjustment circuit sections such that the capacitive coupled current from a phase section of the inductive plasma applicator is in excess of capacitive coupled current from the anti-phase portion. In these embodiments, the wave adjustment circuit provides a deliberate imbalance between the phase and anti-phase of the coupled voltages. In some embodiments 97, this occurs by shifting the zero voltage nodes along the process chamber axially, thereby achieving a bias relative to the plasma discharge. As shown, the phase 95 is imbalanced relative to its anti-phase 96. In other embodiments 99, one phase portion 84 is imbalanced by way of a different period relative to its complementary phase portion 85. Other embodiments are provided where the source plasma voltage is lower relative to ground potential. In the embodiments where imbalance is desirable, the potential difference between the phase and anti-phase potential portions is reduced (or minimized) when the amount of sputtering (e.g., wall sputtering, etc.) is reduced. The amount of sputtering, however, can be increased (or maximized) by increasing the potential difference between the phase and anti-phase potential portions. Sputtering is desirable in, for example, sputtering a quartz target, cleaning applications, and others. Of course, the type of operation used will depend upon the application.

Current maxima on an inductive applicator with distributed capacitance (e.g., helical resonator transmission line, etc.) occur at voltage minima. In particular, conventional quarter-wave helical resonator current is substantially at a relative maximum at its grounded end of the coil, and to a lesser extend in the nearby coil elements. Therefore, partial inductive coupling of power, if it occurs, will tend to be at this grounded end. In conventional half-wave helical resonators, inductive coupling tends to occur at each of the two grounded ends.

In the present invention, substantially anti-symmetric phase and anti-phase inductive half-wave and other fractional wave applicator sections support substantially more inductive coupling at a selected rf voltage node, e.g., FIG. 2A reference numeral 00. This effect is caused by high current flow in the inductor applicator zones (or sections) both directly above and below the node (corresponding to inductor elements in the phase and anti-phase sections at and immediately adjacent to the rf voltage zero point). It should be noted that conventional quarter and half-wave inductively coupled inductive applicators have inductive coupling which abruptly declines below the grounded coil locations because the coil terminates and voltage extrema are present at these locations. This generally produces conventional quarter and half-wave helical resonators that tend to operate in a capacitive mode, or with a substantial fraction of power which is capacitively coupled to the plasma, unless the plasma is shielded from coil voltages, as noted above.

In a specific embodiment, the power system includes selected circuit elements for effective operation. The power system includes an rf power source. This rf power source can be any suitable rf generator capable of providing a selected or continuously variable frequency in a range from about 800 kHz to about 80 MHz. Many generators are useful. Preferably, generators capable of operating into short and open-circuit loads without damage are used for industrial applications. One example of a suitable generator is a fixed frequency rf generator 28.12 MHz-3 kW CX-3000 power supply made by Comdel, Inc. of Beverly, Mass. A suitable variable frequency power supply arrangement capable of the 3 kW output over an 800 kHz to 50 MHz range can be made by driving an IFI Model TCCX3500 High Power Wide Band Amplifier with a Hewlett Packard HP116A, 0–50 MHz Pulse/Function Generator. Other generators including those capable of higher or lower power also can be used depending upon the application.

Power from the generator can be transmitted to the plasma source by conventional coaxial cable transmission line. An example of this transmission line is RG8/U and other higher temperature rated cable (e.g., RG1151U, etc.) with a coaxial TEFLON™ dielectric. In some embodiments, power is fed to conventional end-grounded half-wave helical resonators by positioning a movable tap on the helical coil and connecting a power source between the tap and the ground. In other embodiments, matching networks can be introduced between the coaxial cable power feed and the helical coil tap for flexibility. The matching network will depend on the selected wave configuration and wave adjustment circuits. In a balanced half-wave helical resonator embodiment, for example, the ends of the resonator coil can be terminated with wave adjustment circuits which substantially have zero susceptance. In particular, the wave adjustment circuit is designed as an open circuit by making no electrical connections to the ends of the coil, or establishing an electrical equivalence thereof. Alternatively, the ends of the coil are isolated by high series impedance chokes, thereby maintaining DC coupling to a fixed reference potential. These types of wave adjustment circuits are frequency independent and are "degenerate" cases. In these embodiments, the rf power is provided such that the phase and anti-phase current flows above and below the electrical midpoint (i.e., zero voltage node, etc.) of the coil. This provides for substantially balanced phase and anti-phase current flow from the power source stabilizing desired operation in coil voltages above the midpoint of the coil, and also provides substantially equal phase and anti-phase voltages.

Figure 3:
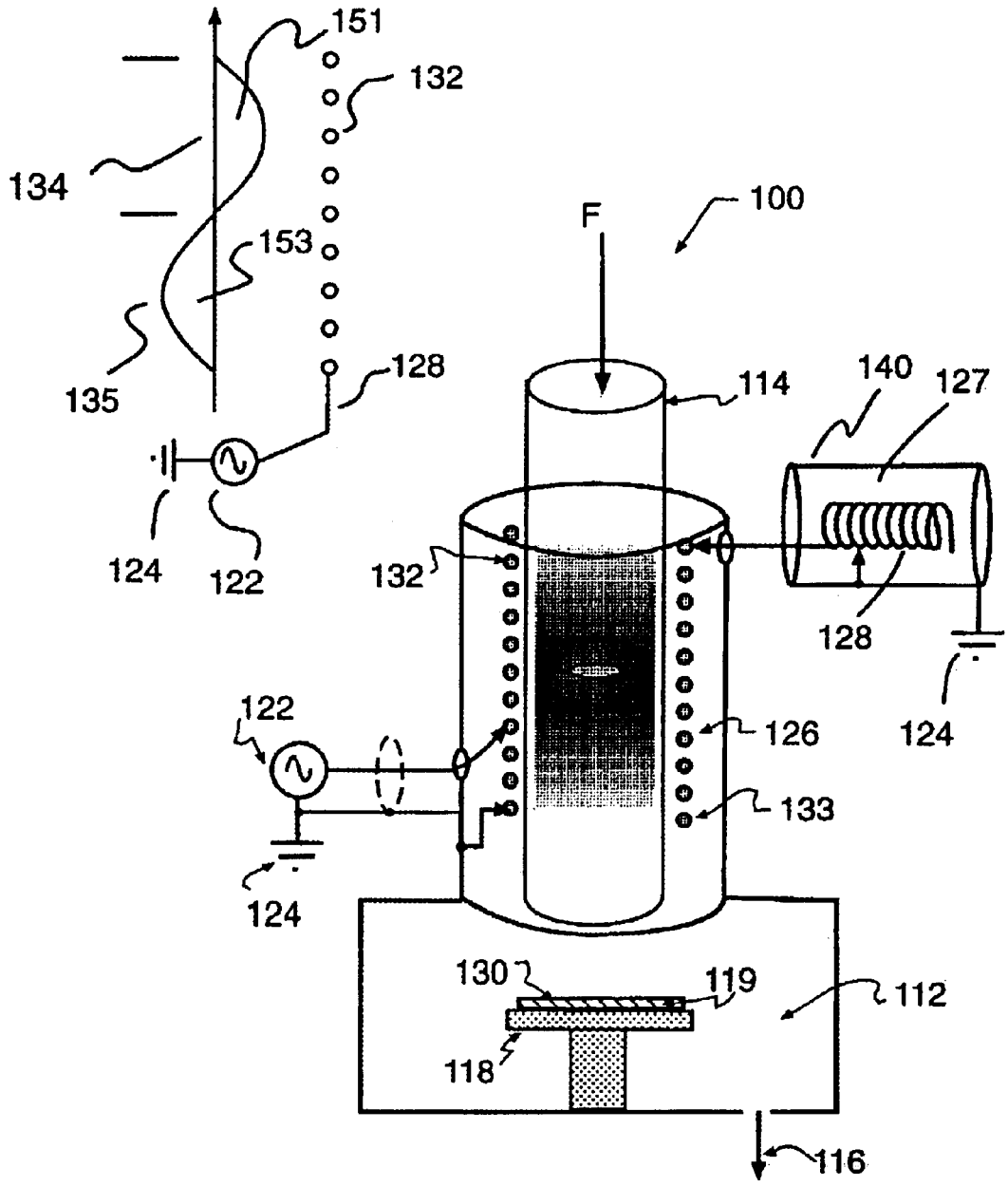
FIG. 3 is a simplified diagram of a chemical vapor deposition apparatus according to the present invention.

The embodiments described above also can be applied to other plasma processing applications, e.g., PECVD, plasma immersion ion implantation (PIII), stripping, sputtering. For instance, FIG. 3 is a simplified CVD apparatus 100 according to the present invention. The present CVD apparatus includes a chamber 112, a feed source 114, an exhaust 116, a pedestal 118, a power source 122, a ground 124, a helical resonator 126, and other elements. The helical resonator 126 has a coil 132, an outer shield 133, and other elements. The chamber can be any suitable chamber capable of housing a product 119 such as a wafer for deposition, and for providing a plasma discharge therein. Preferably, the chamber is a right circular cylinder chamber for providing an uniform plasma species distribution over the product. But the chamber can also be configured in the form of rectangular right cylinder, a truncated cone, and the like. The chamber and fixtures are constructed from aluminum and quartz, and other suitable materials. The plasma discharge is derived from a plasma source which is preferably a helical resonator discharge or other inductive discharge using a wave adjustment circuit or other techniques to selectively adjust phase-anti-phase potentials. The present CVD apparatus provides for deposition of a dielectric material, e.g., silicon dioxide or the like.

The product 119 having an upper surface 130 is placed into the present CVD apparatus for deposition, e.g., plasma enhanced chemical vapor deposition (PECVD), and others. Examples of deposition materials include a dielectric material such as a silicon dioxide ($SiO_2$), a phosphosilicate glass (PSG), a borophosphosilicate glass (BPSG), a silicon nitride ($Si_3N_4$), among others.

In one embodiment, the deposition occurs by introducing a mixture comprising organic silane, oxygen, and an inert gas such as helium or argon according to the present invention. The organic silane can be any suitable organic silicate material such TEOS, HMDS, OMCTS, and the like. Deposition is also conformal in selected instances. As for the oxygen, it includes a flow rate of about 1 liter/per minute and less. A relative flow rate between the organic silane such as TEOS and oxygen ranges from about 1:40 to about 2:1, and is preferably less than about 1:2 in certain applications. A deposition temperature of the organic silane-oxygen layer ranges from about 300 to about 500° C., and can also be at other temperatures. Pressures in the range of 1 to 7 Torr are generally used. Of course, other concentrations, temperatures, materials, and flow rates can be used depending upon the particular application.

This chamber also includes a wave adjustment circuit 127. The wave adjustment circuit 127 is used to provide a helical coil operating with capacitive coupling to selected phase and anti-phase voltages. This portion 127 of the wave adjustment circuit coil also is shielded 140 to prevent rf from interfering with the plasma discharge or external elements, e.g., equipment, power, etc. The coil shield 140 is made of a conductive material such as copper, aluminum, or the like. In one embodiment, an operating frequency is selected and the wave adjustment circuit is adjusted to short circuit the upper end of the helical applicator coil to ground 124. This provides a helical coil operating at approximately a full-wave multiple and has substantially equal phase and anti-phase sections. This full-wave multiple operation provides for balanced capacitance of phase 151 and anti-phase 153 voltages along the coil 132 adjacent to the plasma source. Full-wave multiple operation reduces or even substantially eliminates the amount of capacitively coupled power from the plasma source to chamber bodies (e.g., pedestal, walls, wafer, etc.) at or close to ground potential.

In the present embodiment, the wave adjustment circuit 127 is a variable coil portion 128 of a spiral transmission line, which is selectively placed outside the outer shield 133. Accordingly, when the wave adjustment circuit is adjusted to become a short circuit, the plasma source "sees" only a selected full-wave multiple comprising substantially equal phase 151 and anti-phase 153 of the entire instantaneous AC voltages 134, 135. In this embodiment, stress of the deposited oxide film is often tensile, which can be undesirable.

Alternatively, the wave adjustment circuit 127 provides a helical resonator operating at selected phase and anti-phase voltages that are not full-wave multiples. This wave adjustment circuit provides for a selected amount of capacitive coupling from the plasma source to the chamber bodies. Stress of the deposited oxide film in this embodiment can be made to be zero or slightly compressive. In some embodiments, the oxide films can be deposited with an rf plasma potential of several hundred volts between the plasma source and the substrate to decrease the tendency of the oxide film to absorb moisture. This can occur by adjusting the wave adjustment circuit to add in a small section of transmission line outside of the source and correspondingly shortening the applicator coil (by moving the lower point at which the applicator coil is short-circuited and thereby decreasing the inductance of the applicator coil and electrical length of the helical resonator 126 (e.g., spiral transmission line, etc.) ). Of course, the selected amount of capacitive coupling will depend upon the application.

Figure 4:
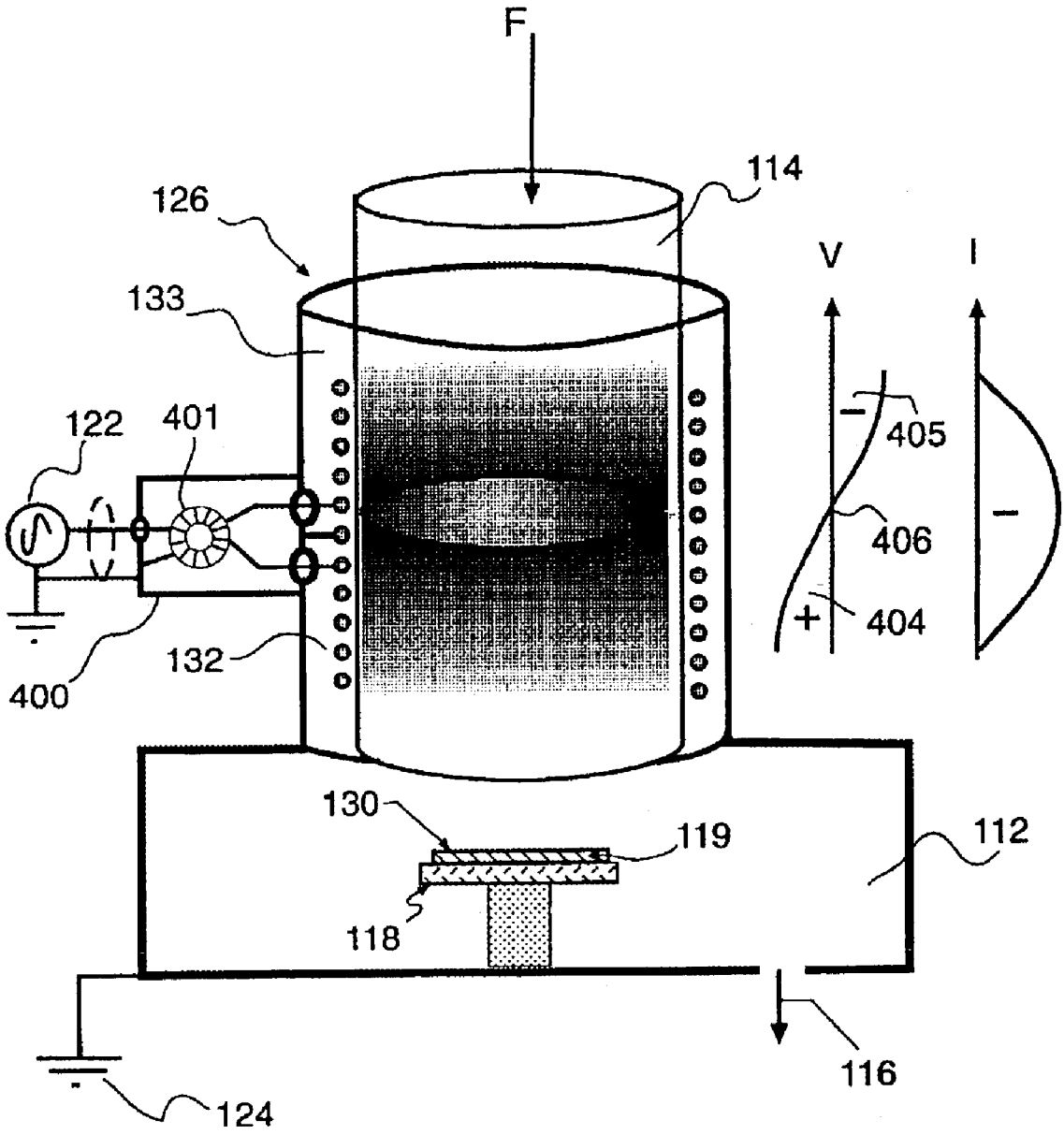
FIG. 4 is a simplified diagram of a stripper according to the present invention.

FIG. 4 is a simplified diagram of a resist stripper according to the present invention. The present stripping apparatus includes similar elements as the previous described CVD apparatus. The present stripping apparatus includes a chamber 112, a feed source 114, an exhaust 116, a pedestal 118, which can be an agile temperature controlled chuck, an rf power source 122, a ground 124, a helical resonator 126, and other elements. The helical resonator 126 includes a coil 132, an outer shield 133, a wave adjustment circuit 400, and other elements. The chamber can be any suitable chamber capable of housing a product 119 such as a photoresist coated wafer for stripping, and for providing a plasma discharge therein. The plasma discharge is derived from a plasma source, which is preferably a helical resonator discharge or other inductive discharge using a wave adjustment circuit or other techniques to selectively adjust phase/anti-phase potentials. Of course, in some applications other configurations such as parallel plate capacitive discharges and microwave powered discharges such as electron cyclotron resonance machines, resonant cavities and slow [waver] *wave* applicator structures may also be suitable. The present stripping apparatus provides for stripping or ashing photoresist, e.g., implant hardened, etc. Further examples of such a stripping apparatus are described in the experiments section below.

In this embodiment, the wave adjustment circuits rely upon open circuits (i.e., zero susceptance). Power transfer can be effected with a balanced feed such as an inductively-coupled push-pull arrangement with means such as coupled inductors. Techniques for constructing these coupled inductors are described in, for example, "The ARRL Antenna Book," R. D. Straw, Editor, The American Radio Relay League, Newington, Conn. (1994) and "The Radio Handbook," W. I. Orr, Editor, Engineering Ltd, Indiana (1962), which are both hereby incorporated by reference for all purposes. In one embodiment, a ferrite or powdered iron core "balun" (balanced-unbalanced) toroidal transformer (i.e., broadband transmission transformer, broadband transformer, etc.) 401 can be used to provide balanced matching from a conventional unbalanced coaxial transmission line. Techniques for constructing toroidal baluns are described in, for example, "Transmission Line Transformers," J. Sevick, 2nd Edition, American Radio Relay League, Newington, Conn. (1990). The toroidal transformer is coupled between the rf power source 122 and the coil 132. The midpoint 406 between the phase 405 and anti-phase voltage on the coil is effectively rf grounded, hence it may be convenient to directly ground this midpoint of the inductive application in some embodiments for stability. This permits alternate operation in which power may be coupled into the inductive applicator (e.g., coil, etc.) with a conventional unbalanced feed line tapped on one side of the center. Push-pull balanced coupling ignites the plasma more easily than conventional unbalanced coil tap matching and generally is easier to adjust in selected applications.

Figure 5A:
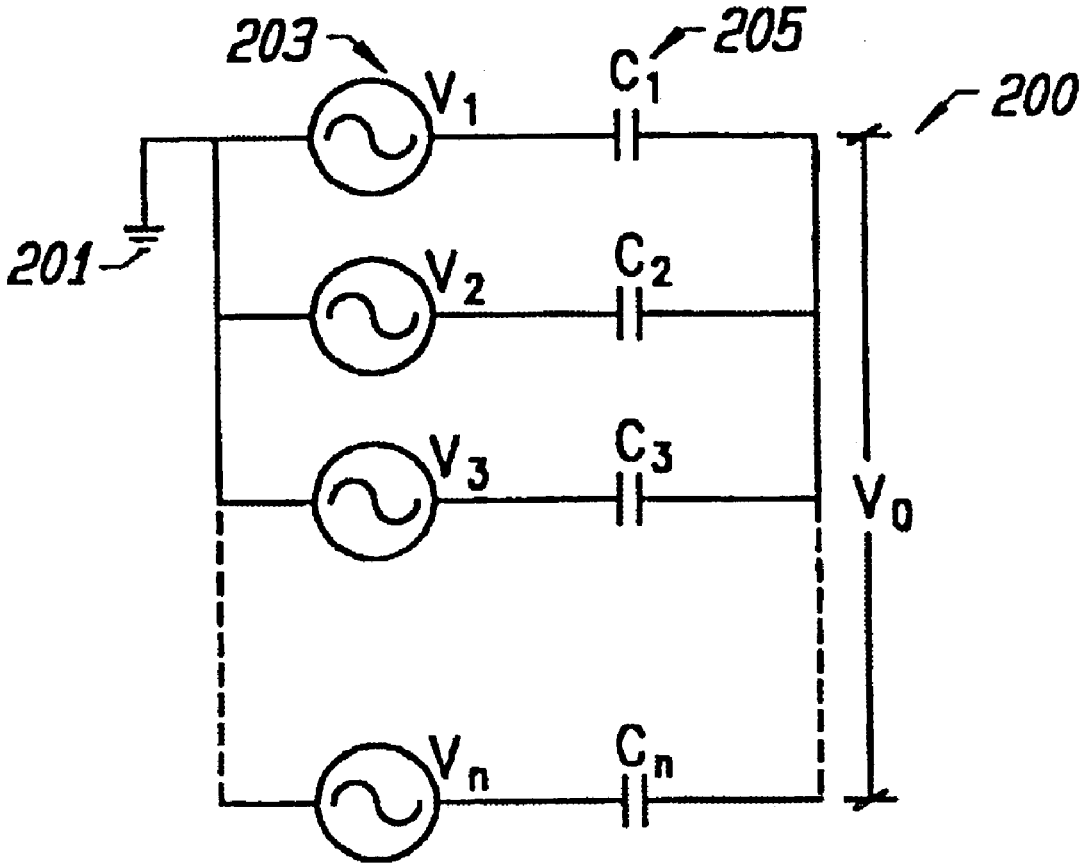
FIGS. 5A–5C are more detailed simplified diagrams of a helical resonator according to the present invention.

Referring to the helical resonator embodiments operating at substantially equal phase and anti-phase potentials, FIG. 5A is a simplified diagram 200 of an equivalent circuit diagram of some of them. The diagram is merely an illustration and should not limit the scope of the claims herein. The equivalent circuit diagram includes a plurality of rf power supplies ($V_1$, $V_2$, $V_3$. . . $V_n$) 203, representing for example, a single rf power source. These power supplies are connected in parallel to each other. One end of the power supply is operably coupled to a ground connection 201. The other end of the power supplies can be represented as being connected to a respective capacitor ($C_1$, $C_2$, $C_3$. . . $C_n$). Each of these capacitors are connected in parallel to each other. During this mode of operation, no significant voltage difference exists between any of the common side of the capacitors, as they are all connected to each other in parallel.

Figure 5B:
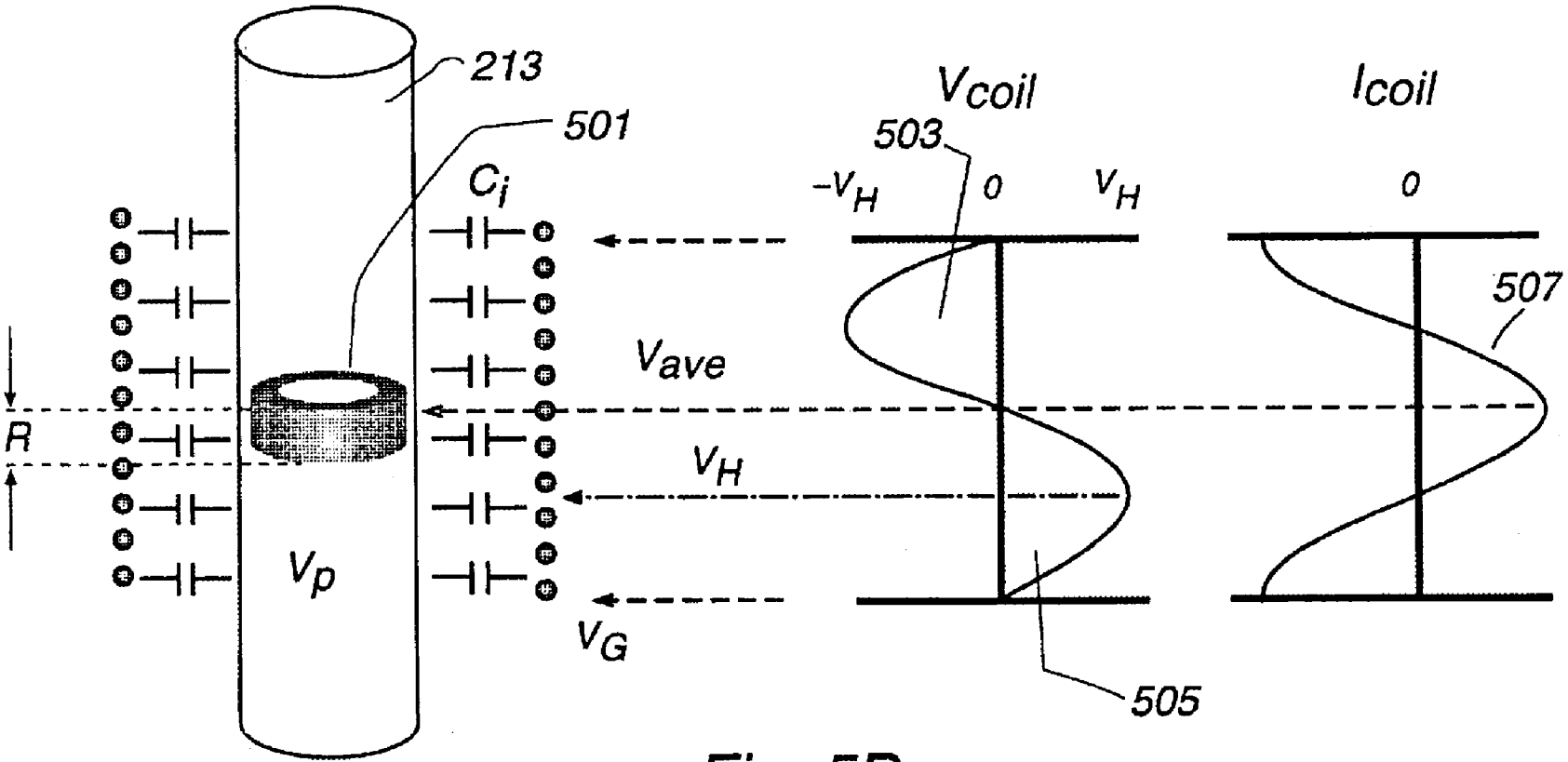
Figure 5C:
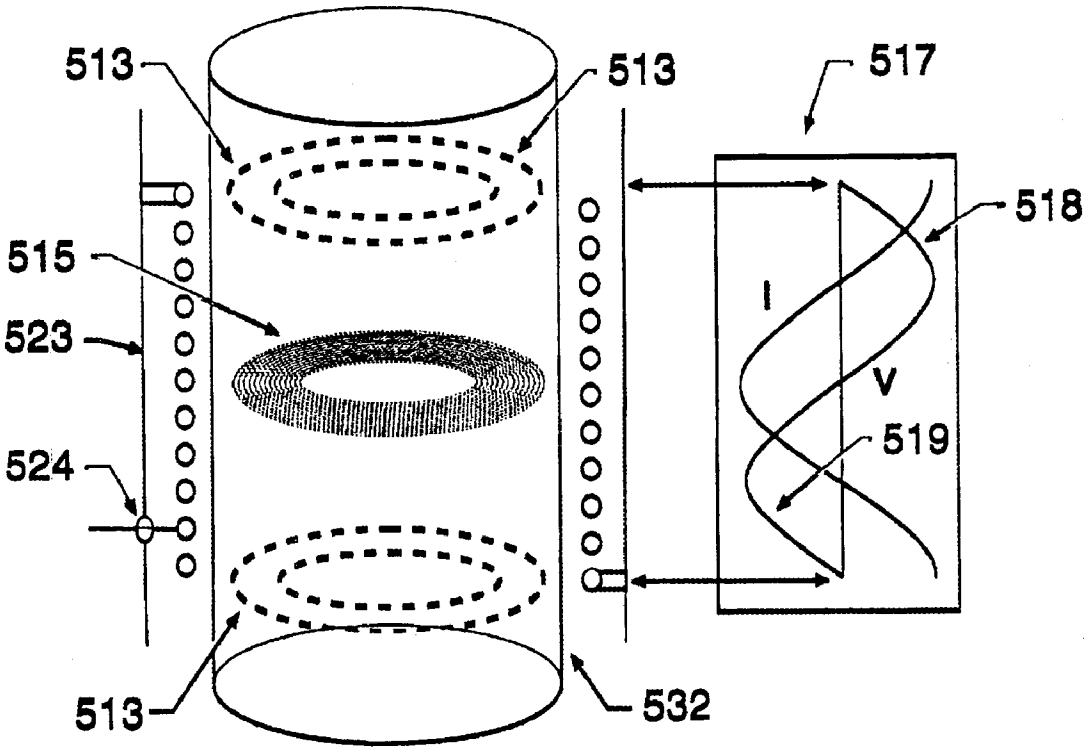

FIG. 5B is a simplified diagram of instantaneous AC voltage and current along a helical resonator coil of FIG. 5A where each end of the inductive applicator is short circuited. The diagram is merely an illustration and should not limit the scope of the claims herein. This diagram includes the discharge tube 213 and an inductive plasma discharge (or plasma source) 501 therein. As shown, the plasma discharge includes an intensified "donut-shaped" glow region 501 that occupies a limited range (R) of the discharge tube 213. The plasma discharge has an average voltage potential ($V_{ave}$) of magnitude that is substantially within a few zero volts (i.e., the ground potential). As can be seen, the plasma discharge 501 has capacitively coupling elements to $V_H$ and $V_G$. But the average voltage potential of this plasma discharge is substantially zero. This operation provides for balanced capacitance of phase 503 and anti-phase 505 voltages along the coil adjacent to the plasma, thereby substantially preventing capacitively coupling from the plasma source to chamber bodies. As also shown, a current maxima 507 exists at $V_{ave}$, which corresponds to an inflection point between the phase 503 and the anti-phase 505.

In an alternative operating mode, rings of plasma caused by inductively coupled plasma current are visible near top and bottom extremes of the inductive applicator, as illustrated by FIG. SC. This operating mode is generally for a full-wave 517 inductive coupling coil operated at a very high power, e.g., maximum power input to the inductive applicator is often limited by thermal considerations and breakdown. The rings 513, 515 of current in the plasma discharge are simulated by maximum coil current areas corresponding to voltage minima at the top and bottom shorted ends of the coil. Under these high power conditions, subordinate current rings are detectable and some excitation is often visible in the intermediate regions. This excitation is partially caused by capacitively driven currents within the discharge coupled to the voltage maximum and voltage minimum positions along the inductive applicator.

Alternatively, subordinate inductive plasma current rings at the top and bottom ends 513 of the resonator do not appear with limited input power. The coil current and inductive flux fall beyond the ends of the inductive applicator so that a single inductive ring 515 in the center portion is more stable, provided that the conductivity of the plasma is large enough to support a single current ring at a specified input power.

In alternative applications using high power operation, no secondary plasma current rings may be desirable. These applications often have substantially minimum internal capacitive coupling. In these applications, the inductive applicator (e.g., coil) abutting the vacuum vessel may be shortened from a full wave to an appropriate length such that only the central current maxima exists on the coil abutting the plasma source and the potential difference between maximum and minimum voltage on the applicator is substantially reduced. The present application is achieved by stabilizing the desired waveform along the applicator by appropriate impedance wave adjustment circuits.

An effective conventional method employed to avoid plasma potential shift in conventional commercially available inductive sources is to shield the plasma from the electrical fields on the inductive coupling element (commonly a multi-turn coil) by inserting a grounded conductive member between the inductive driving element and the plasma discharge tube. Shielding is, however, cumbersome and inconvenient and has serious disadvantages in practice. Shields couple to inductive applicator elements and can cause wide excursions in the natural resonance frequency, which are not predicted by conventional analytical design formulae. This often results in laborious trail and error and iterative mechanical designs to achieve a desired resonance.

Another disadvantage of shielding is that shields often make it difficult to achieve initial ignition of the plasma since shields generally exclude capacitive electric fields in the plasma discharge tube. Those with skill in the art will recognize that in practice, substantial ionization (e.g. charge carriers) must be present in the tube volume before in inductive plasma current can be sustained. Thus, it is often said that a capacitive plasma must be ignited first in order to sustain an inductive plasma. This is not completely true since other external means of generating ionization (e.g. an intense photoionizing source, electron beams, etc.) can be used to generate the ionization which is prerequisite to sustaining an inductive plasma. However, a capacitive discharge is often a convenient and cost-effective means to ignite some plasma which is a prerequisite to starting and sustaining an inductive discharge.

In general, wave adjustment circuits are employed to substantially diminish capacitive coupling between a plasma source and an inductive applicator. If most capacitive coupling is removed, it may be difficult to ignite a plasma. However, wave adjustment circuits also provide a means to overcome the difficulty with igniting a plasma in the absence of capacitive coupling under steady state operating conditions. This means is provided by electrically, mechanically, or electromechanically tuning the wave adjustment circuits prior to the time of desired plasma ignition in a manner which generates an additional imbalance and capacitive coupling to the discharge volume. Of course, the characteristics of the plasma as a load to the applicator will dynamically change during ignition. The wave adjustment circuit can also be continuously tuned under feedback control during ignition in order to provide a desired voltage coupling and diminish undesired transients during plasma breakdown.

Insertion of the shield close to high voltage RF point in a network (such as the voltage maximum points in a helical resonator or the high potential driven side of a TCP coil) also causes large displacement currents to flow through the capacitance between the shield and coil. This high potential difference is also a potential cause of damaging rf breakdown across the air gap, hence the gap may require protection by inconvenient solid or liquid dielectric insulation. The displacement current flow causes power loss and requires that higher power RF generating equipment be used to compensate for the power loss. Coupling loss in the plasma source structure is also undesirable from the standpoint of thermal control. These limitations are overcome by the present invention using the wave adjustment circuits, an inductive applicator of selected phase length, and other elements.

Figure 6:
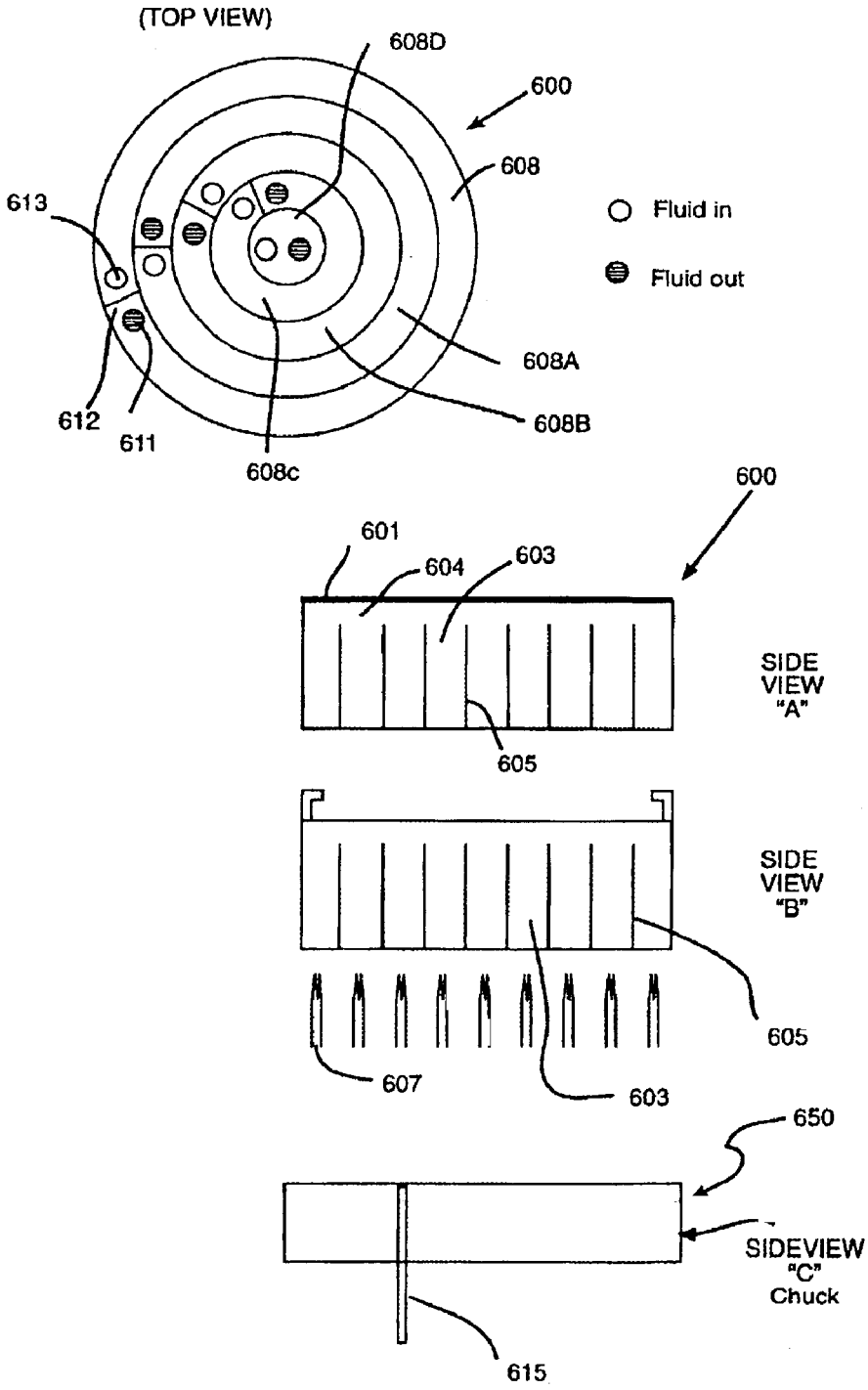
FIG. 6 is a simplified block diagram of a substrate holder according to the present invention.

FIG. 6 is a simplified block diagram of a substrate holder 600 according to the present invention. This diagram is merely an illustration and should not limit the scope of the claims herein. One of ordinary skill in the art would recognize other variations, modifications, and alternatives. The substrate holder 600 or [suceptor] *susceptor* includes, among others, a lower or backside surface 608, which includes a plurality of concentric zones 608A, 608B, 608C, and 608D. In a specific embodiment, each of the zones can be in fluidic communication with each other and can be partly separated from each other. Each of the zones can have an inlet 613 and an outlet 611. Fluid enters the inlet, traverses in an annular manner in the zone, and leaves the outlet. A baffle can separate the inlet from the outlet. Each of the zones can have an inlet and outlet, which are independent from the other inlets and outlets. Alternatively, the inlet and outlets can be in fluid communication with each other.

The side-view diagram shown as "SIDE-VIEW A" illustrates a plurality of zones 603, which correspond to each of the concentric zones 608A, 608B, 608C, and 608D. Each zone is separated, in part, from each other by a baffle 605. Each baffle extends from a lower region of the substrate holder toward an upper portion of the substrate holder, but does not touch the upper surface 601 of the substrate holder. In preferred embodiments, the baffles do not touch the upper surface. Accordingly, the temperature of the baffles, which may be different from the fluid, does not create an uneven temperature distribution along the upper surface 601. Additionally, the upper region 604, which is an open region within the substrate holder, provides fluid communication between each of the zones. Fluid communication in connection with the upper surface also provides an even distribution of temperature along the upper surface.

The fluid can be used to heat or cool the upper surface of the substrate holder. In a specific embodiment, the fluid generally should have a relatively high thermal conductivity and large heat capacity. The fluid should also be substantially non-corrosive, easy to transport, and can withstand a relatively large temperature range and still maintain its fluid characteristics. Additionally, the fluid should be able to be pumped and *be* substantially non-reactive with the substrate holder material itself. The fluid can be any commercial heat transfer fluid selected for the desirable temperature range. As noted, the substrate holder and upper surface cools down or is heated up by way of the fluid. The fluid can traverse through the zones and can absorb thermal energy or release thermal energy by an external heat transfer device such as the one described below, but can be others.

In a specific embodiment, the substrate holder also includes a plurality of heating elements 607. The heating elements can selectively heat one or more zones in a desirable manner. As shown in the "SIDE-VIEW B" diagram, each of the heating elements can be directed to a single zone 603, which has an adjacent baffle 605. Alternatively, the heating elements can be directed to multiple zones or other specific regions of the substrate and in particular the backside of the substrate according to some embodiments. The heating elements can be any suitable device for supplying heat energy to the fluid. The heat can be supplied by single or in combination using radiation, conduction, and convention. As merely an example, the heating element can be a resistive heating unit, an infrared heating unit, and others. Of course, the type of heating unit used depends highly upon the application. Alternatively, the heating unit can also be replaced by cooling units.

The present invention provides a substantially uniform temperature distribution along the upper surface 601 of the substrate holder. In a specific embodiment, the uniformity of the temperature is within one Degree Celsius along the entire surface which comes in contact with the object such as the wafer. Preferably, the wafer temperature also tracks the temperature uniformity of the upper surface. In other embodiments, the uniformity of the of the temperature is within one-tenth of a Degree Celsius along the entire surface which comes in contact with the object such as the wafer. Preferably, the wafer also has a uniform temperature distribution along the wafer.

The substrate *holder* has an upper surface, which holds an object in a secure manner during processing. The upper surface is generally made of a suitable material that has desirable heat transfer characteristics. In a specific embodiment, the upper surface is made using a low thermal mass, high conductivity material. As merely an example, the upper surface can be a diamond-like or diamond film overlying a copper or copper-like substrate. Of course, the type of surface used depends upon the application.

In a specific embodiment, the substrate holder also has temperature sensing units *615* such as the one shown in "SIDE-VIEW C." The temperature sensing unit can be any suitable unit that is capable of being adapted to the upper surface of the substrate holder. Alternatively, the temperature sensing unit can measure the temperature of the fluid or lower surface of the substrate holder. As merely an example, the temperature sensing unit is a [“fluro-optic”] *“fluoroptic”* sensor unit made by a company called Luxtron in Santa Clara, California. Alternatively, the sensing unit can be a [an edge band] *band edge* IR sensor or the like. The sensing unit is capable of measuring a variety of spatial locations along the upper or lower surface of the substrate holder. The substrate holder can be implemented using a variety of systems for heating and/or cooling applications such as the one described below, but can be others.

Figure 7:
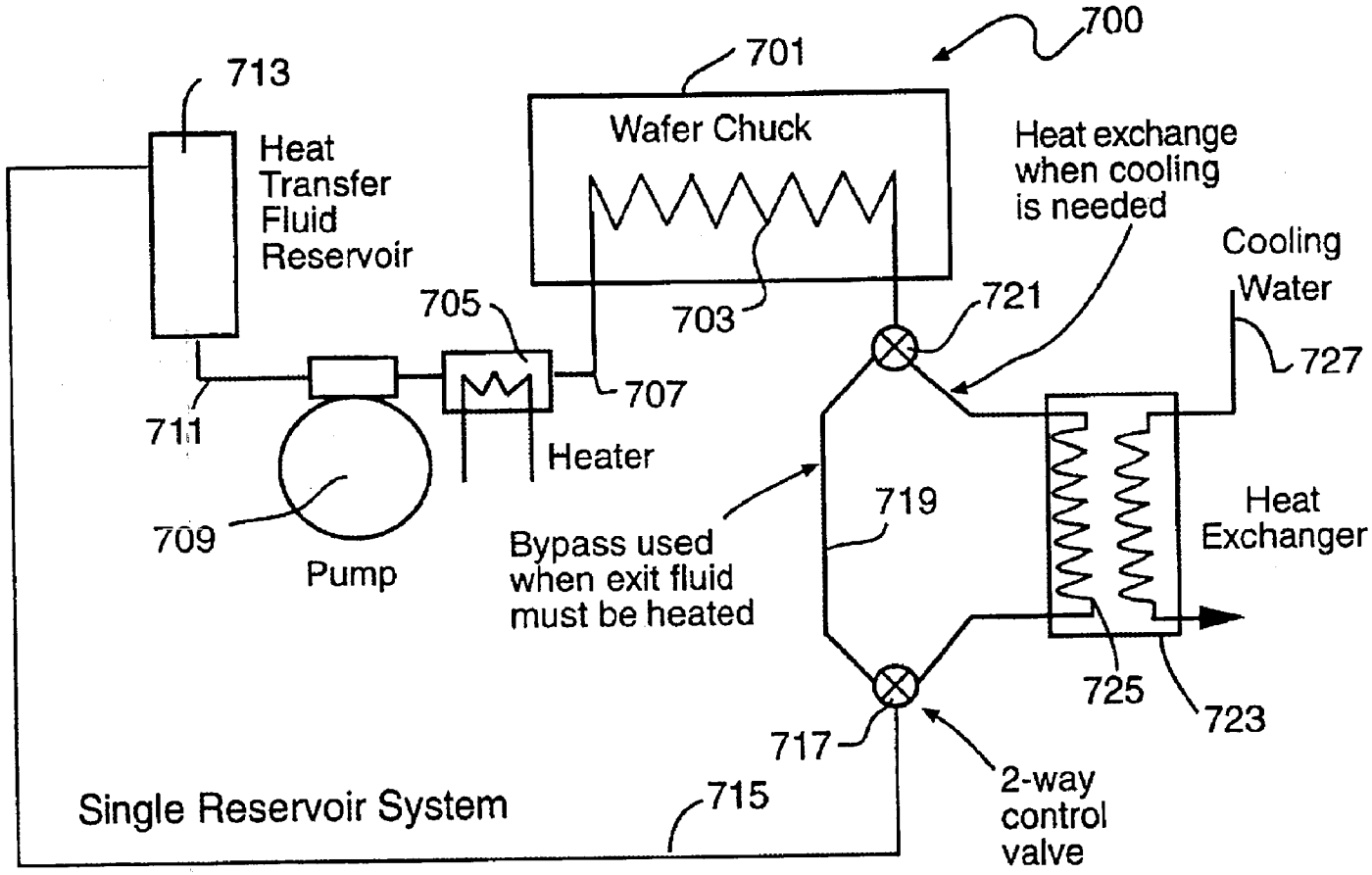
FIG. 7 is a simplified diagram of a temperature control system according to an embodiment of the present invention.

FIG. 7 is a simplified diagram of a temperature control system 700 according to an embodiment of the present invention. This diagram is merely an illustration and should not limit the scope of the claims herein. One of ordinary skill in the art would recognize other variations, modifications, and alternatives. Among other elements, the system 700 can be used to heat and/or cool the wafer chuck or substrate holder 701. As shown, system 700 includes substrate holder 701, which is coupled to a heating unit 705 by way of line 707. Heating unit 705 is coupled to fluid reservoir 713 and pump 709 by way of line 711.

Fluid from the fluid reservoir is pumped from the reservoir through the heating unit, which selectively sets the temperature of the fluid. The fluid leaves the heating unit at the selected temperature and traverses through the substrate holder, which can be similar to the one shown above, but can also be others. The fluid temperature selectively transfers energy in the form of heat to the wafer holder to a desirable temperature. Fluid leaves the substrate holder and traverses through node 721 and branch 719. Fluid traverse through branch 719 and node 717. Fluid leaves node 717 and returns back to the fluid reservoir via line 715.

In an alternative embodiment, the fluid can also be cooled using a heat exchanger 723. The fluid leaves the substrate holder and enters node 721. Fluid then enters the heat exchanger and traverses through loop 725. Thermal energy in the form of heat transfers to fluid in loop 723, which is cooler in temperature and draws heat away from the heat in the fluid in loop 725. In a specific embodiment, cooling fluid 727 enters and leaves the heat exchanger.

In a specific embodiment, system 700 operates in a manner to program a process temperature of the substrate holder. In this process, the reservoir with a suitable heat transfer fluid is maintained at a temperature below the desired process temperature. The fluid is circulated through the substrate holder or wafer chuck by the pump. The fluid line downstream of the pump is equipped with [the] an electrical heater which is capable of heating the fluid to a desired temperature. The desired fluid temperature is determined by comparing the desired wafer or wafer chuck set point temperature to a measured wafer or wafer chuck temperature (this measurement can performed with a thermocouple, thermistor, pyrometer, [fluor optic] *fluoroptic* sensor or other sensing means). If the measured temperature of the wafer [of chuck] *or chuck* is below the desired temperature, a suitable control algorithm such as a proportional controller or a proportional-integral-derivative (i.e., PID) controller algorithm increases the temperature by supplying more power to the heater.

The temperature of fluid emerging from the chuck is also measured (normally there will be a small temperature difference since there is heat exchange between the fluid and chuck). If this temperature is above the desired fluid temperature the fluid stream is diverted to a heat exchanger via control valves 1 and 2, which are respectively at nodes 721 and 717. If this temperature is less than or equal to the desired fluid temperature the fluid stream can be made to bypass the heat exchanger, or optionally can be heated in a heat exchange system. Since the temperature of commonly used heat exchangers cannot be changed rapidly, the heat exchanger is usually maintained at a single temperature sufficiently below the lowest desired fluid temperature to achieve the lowest desired temperature to be attained. The heat exchanger, fluid flow rate, coolant-side fluid temperature, heater power, chuck, etc. should be designed using conventional means to permit the heater to bring the fluid to a setpoint temperature and bring the temperature of the chuck and wafer to predetermined temperatures within specified time intervals and within specified uniformity limits.

In a preferred embodiment, the present invention uses a microprocessor based system to oversee the operations of the system described above. The microprocessor based system can have input and output ports, which are coupled to each of the elements, e.g., pump, heater, fluid reservoir, substrate holder. The microprocessor based unit selectively turns ON and/or OFF one or more of the elements to control the temperature of the substrate holder to provide a uniform distribution of temperature across the surface of the substrate holder.

Figure 8:
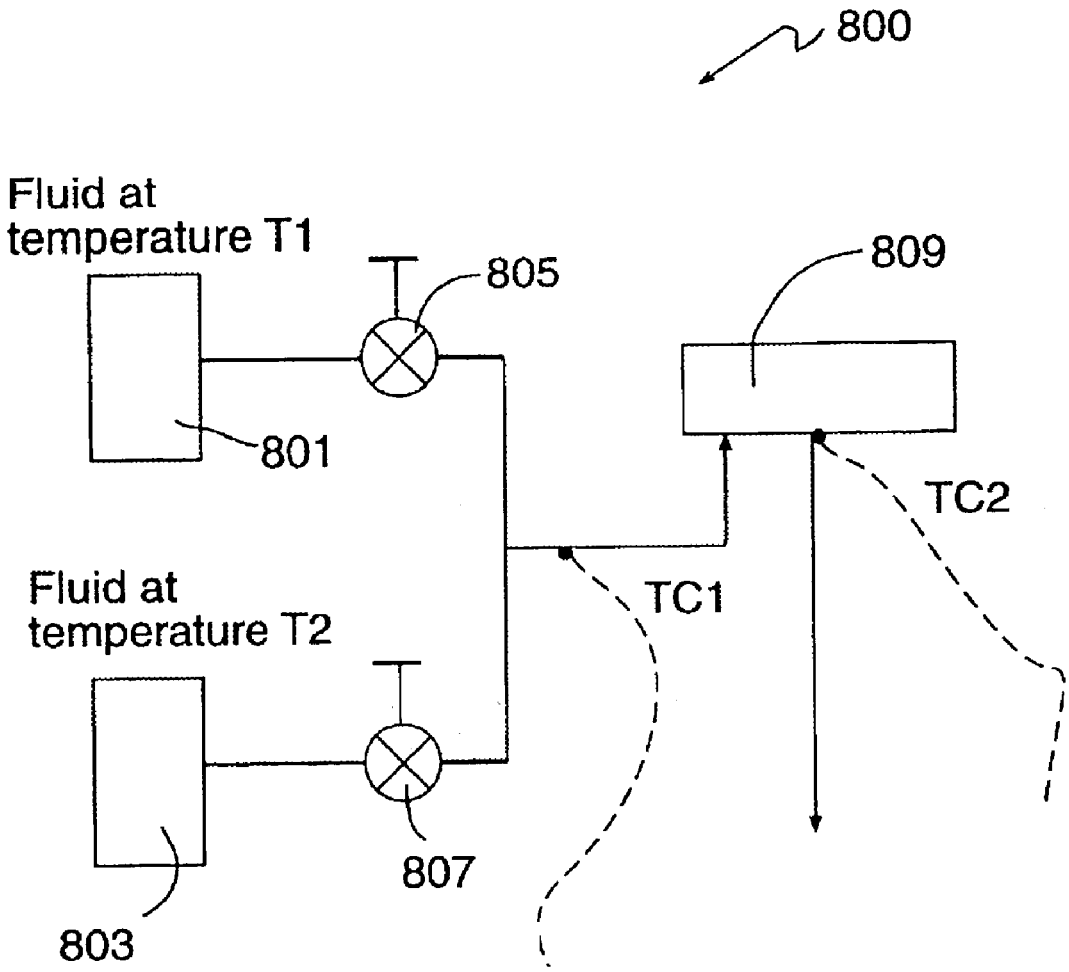
FIG. 8 is a simplified diagram of a fluid reservoir system according to an embodiment of the present invention.

In an alternative embodiment, FIG. 8 is a simplified diagram of a multiple fluid reservoir system 800 according to an embodiment of the present invention. This diagram is merely an illustration and should not limit the scope of the claims herein. One of ordinary skill in the art would recognize other variations, modifications, and alternatives. As shown, system 800 depicts an automatic system for agile temperature control of the substrate holder or wafer chuck 809 using two reservoirs 801, 803, but is not limited to two *and* can be more than two, if desirable. The wafer chuck can be rapidly brought to temperature T1 by directing flow through proportional control valve [V1] *805* to the wafer chuck. Similarly, the chuck can be brought substantially to a temperature T2 by directing only a flow from the reservoir T2 to the wafer chuck. Temperature sensor TC1 measures the temperature of the heat transfer fluid entering the wafer chuck and sensor TC2 monitors temperature of fluid exiting the wafer chuck. Valves [V1 and V2] *805 and 807* are controlled by a control system which adjusts the total volumetric flow rate of fluid flowing into the wafer chuck as well as the ratio of fluid flowing through [V1 and V2] *805 and 807*. The ratio is set so that the temperature monitored by TC1 is at a predetermined value selected to achieve a desired wafer chuck temperature. The flow rate of a fluid flowing from both reservoir [1 and 2] *801 and 803* is metered by conventional means and set to fix the temperature difference measured between [TC2 and TC2] *TC1 and TC2* at a pre-specified difference. This difference is selected to meet a temperature uniformity specification. The temperature difference allowed is chosen so that etching non-uniformities caused by temperature gradients are below a predetermined permissible level which includes an allowance for normal variability in measurements, sensor, the control system etc. The flows can be digitally controlled *with* proportional metering values as illustrated or alternately they can be controlled by computer-controlled variable speed pumps, as will be well known to those skilled in the art. In addition to the sensors TC1 and TC2, it is convenient to monitor the top surface chuck temperature and the wafer temperature so that TC1 can be selected to maintain the wafer temperature within a specific amount of a wafer etching or CVD temperature (when the chuck and etching temperature are greater than the temperature of the chamber walls, the wafer temperature will generally be slightly less than the chuck temperature owing to heat transfer resistance between the chuck and wafer and thermal coupling between the wafer and surrounding chamber walls).

Figure 9:
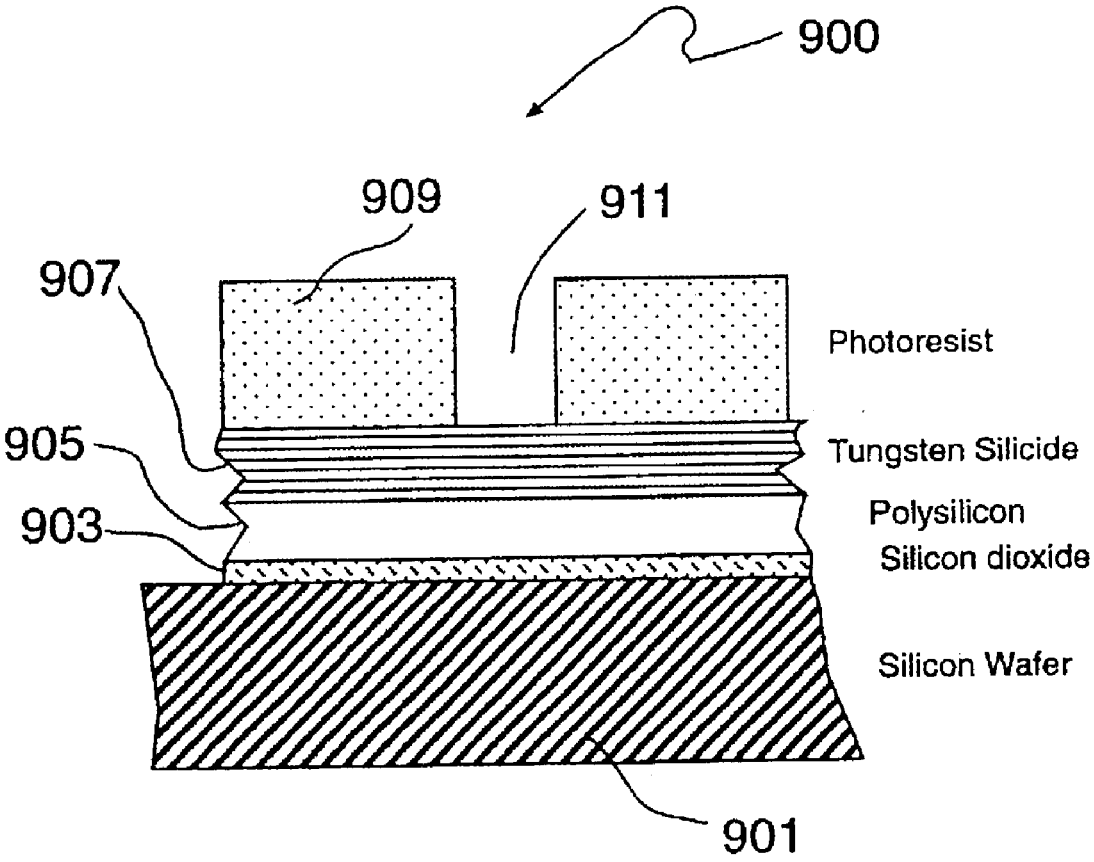
FIG. 9 is a [simplified diagram of a] simplified diagram of a semiconductor substrate according to an embodiment of the present invention.

FIG. 9 is a simplified diagram of [a simplified diagram of] a semiconductor substrate 900 according to an embodiment of the present invention. This diagram is merely an illustration and should not limit the scope of the claims herein. One of ordinary skill in the art would recognize other variations, modifications, and alternatives. As shown, the substrate is a stack of layers that is to be patterned. The stack includes a dielectric layer such as a thin 100 Å gate oxide layer 903 on a substrate (e.g., silicon wafer) 901 on which 2000 Å of tungsten silicide 907 or other material is deposited on the conductive layer, which can be polysilicon 905. A masking layer such as 2 microns of photoresist 909 is spin coated over the tungsten silicide and patterned by conventional photolithography techniques. The patterned layer includes an opening 911, which exposes the underlying tungsten silicide layer. It is desired to anisotropically etch the stack down to the silicon dioxide layer in order to define a patterned structure which can be an EEPROM device or other integrated circuit element. Although this can be accomplished by etching in a conventional parallel plate reactor using a chlorine bearing plasma, it can be difficult to avoid removing excessive polysilicon during the overetching period, which is required to assure that the polysilicon is completely removed from within the unmasked regions. Furthermore, the resist mask must generally be removed after etching this stack. Since the temperature for the stack etch (i.e., often 50° C. to 100° C.) is too low to achieve an adequate resist stripping rate (generally a rate of a few microns per minute is desirable), stripping is often done in a separate chamber [of] *or* in separate resist stripping equipment.

The temperature is programmed by use of this invention to achieve better control of the etching process as well as to permit stripping the resist in the same chamber and [controlled] *control* by the same process program which is used for stack etching.

A process according to the present invention can be briefly outlined as follows:

(1) Provide patterned stack in chamber;

(2) Perform native oxide breakthrough using sulfur hexafluoride bearing plasma;

(3) Ignite chlorine bearing plasma;

(4) Etch tungsten silicide layer at a first substrate temperature;

(5) Detect polysilicon layer;

(6) Perform over etch to clear tungsten;

(7) Expose polysilicon;

(8) Etch polysilicon;

(9) Clear polysilicon to oxide;

(10) Stop chlorine bearing plasma;

(11) Feed oxygen;

(12) Ignite oxygen *plasma*;

(13) Strip photoresist at a second substrate temperature; and

(14) Extinguish oxygen plasma

The above sequence of steps are merely examples to show an etching process that uses more than one temperature. Here, the etching process for tungsten silicide and polysilicon occurs at a first temperature and an ashing process occurs at a second temperature, where the first temperature is lower than the second temperature. By way of the present invention, multiple temperatures can be used in a single chamber to perform multiple processes. Details of the present invention are shown by way of FIG. 10, for example.

Figure 10:
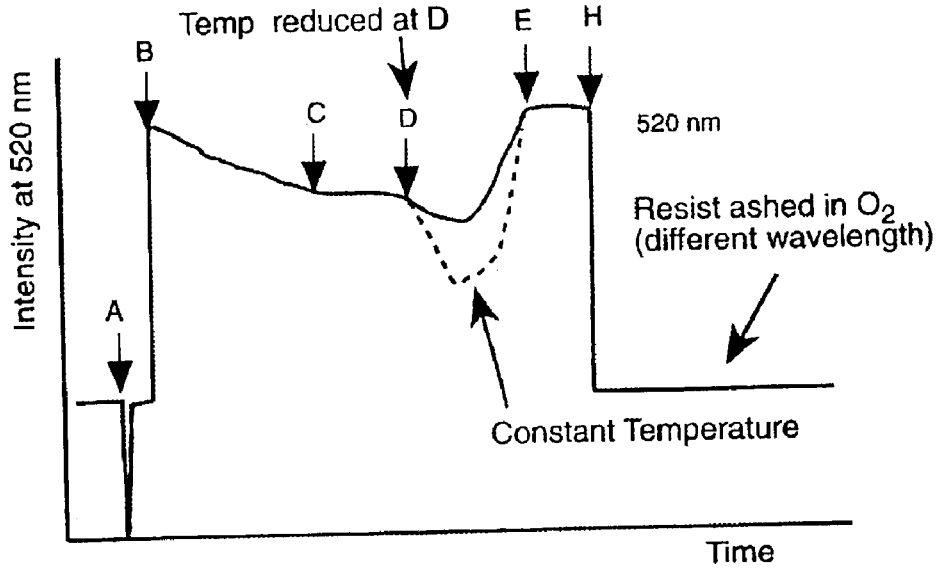
FIG. 10 is a simplified [flow diagram of a heating] process according to the present invention.
Figure 10:
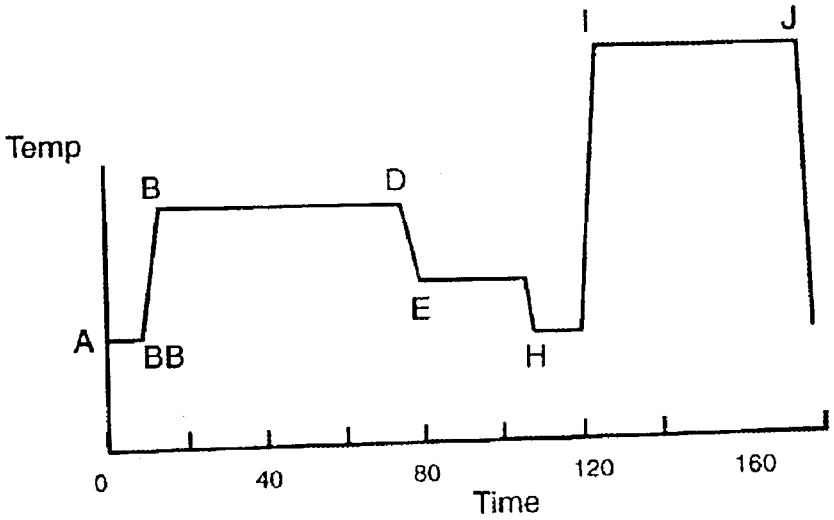

FIG. 10 [is] *shows* a simplified [flow diagram of a heating] process according to the present invention. This [diagram] *process* is merely an illustration and should not limit the scope of the claims herein. One of ordinary skill in the art would recognize other variations, modifications, and alternatives. As shown, *there is* an isotropic breakthrough step during which an $SF_6$ plasma is [sued] *used* to remove very thin native oxide can be conducted at a low temperature such as room temperature. Ordinarily the breakthrough step is conducted at a high temperature. High temperatures have a serious disadvantage in that the etching rate of both oxide and tungsten silicide by $SF_6$ may be isotropic. Therefore the duration of the breakthrough step, especially if the native oxide layer is thin, must often be limited to a few seconds to avoid undesired undercut. At low temperature the etching rate is slower and therefore the extent to which materials under the native oxide are etched is easier to control.

At the end of the breakthrough step, at time BB, the control program increases within several seconds to a higher steady state value at time [C] *B*. The tungsten silicide is etched at this temperature until this layer is breached at random locations on the wafer. This endpoint is conveniently observed by a change in the slope of intensity of an optical light emission from the plasma such as optical emission at 530 nm (point C in FIG. 10). The complete removal of the unmasked tungsten silicide areas is similarly signaled by a change in light emission such as that shown at point D (at time D all "patches" of the tungsten silicide are "cleared" from unmasked polysilicon areas; the signal begins to rapidly decease at time D because at constant temperature, polysilicon consumes chlorine more rapidly than tungsten silicide (e.g. a faster etch rate) and optical emission at this wavelength originates from a chlorine species.

Since it is not practical to change chuck temperature, at this point the etch rate would increase rapidly. As a consequence it can often be difficult to detect and terminate the polysilicon etching step when the thin oxide layer is reached. Another problem associated with the use of a single temperature for both silicide and polysilicon layers is that chlorine etching processes often undercut (etch along the mask direction, sideways- e.g. the etch is partly isotropic) silicon at the elevated temperatures suitable for a low residue tungsten silicide etch. Therefore it is highly desirable and advantageous to reduce the etching temperature during the polysilicon etch. The wafer temperature is gradually reduced at point [DD] *D* in order to achieve a slower and more anisotropic polysilicon etching step. The temperature necessary to etch tungsten silicide and *polysilicon* during this temperature programmed sequence are *schematically* compared in [the FIG] *FIG. 10*. [The] *As shown, the* emission signal intensity increases when the temperature is lowered because the rate of consumption of chlorine species by the etching process is slowed (the rate decreases with decreasing temperature). Stopping the etch process [at endpoint] *beyond the endpoint* where all of the silicon has "cleared," denoted by E is also easier and less critical because attack on the oxide has also slowed. *FIG. 10 shows temperature changes between BB and B and between points D and E occurring over intervals which subtend less than about 5 percent of the tungsten silicide/polysilicon stack etching time.*

At point H the stack etch is complete and the plasma is extinguished. The flow of feed gas comprising $Cl_2$ for etching is stopped and a flow of $O_2$ is started. A plasma discharge in oxygen at elevated temperatures will strip resist rapidly. At time I the wafer temperature is increased rapidly to a selected value in the range 180–220° C. and a plasma is ignited to remove the resist. After a selected interval the plasma is extinguished again and the chuck temperature rapidly lowered. These sequences of steps merely provide an example of the present invention. Other examples can also occur and the description above should not be limiting in any manner.

While the invention has been described with reference to specific embodiments, various alternatives, modifications, and equivalents may be used. In fact, the invention also can be applied to almost any type of plasma discharge apparatus. This discharge apparatus can include an apparatus for plasma immersion ion implantation or growing diamonds, TCPs, and others. This discharge apparatus can be used for the manufacture of flat panel displays, disks, integrated circuits, diamonds, semiconductor materials, bearings, raw materials, and the like.

Therefore, the above description should not be taken as limiting the scope of the invention which is defined by the appended claims.

What is claimed is:

[1. A method of etching a substrate in the manufacture of a device, said method comprising steps of:

placing a substrate having a film thereon on a substrate holder in a chamber, said substrate holder having a selected thermal mass; and performing a first etching of a first portion of said film at a first temperature and performing a second etching of a second portion of said film at a second temperature, said first temperature being different from said second temperature;

wherein said selected thermal mass allows a change from said first temperature to said second temperature within a characteristic time period to process said film.]

[2. The method of claim 1 wherein said first temperature is changed to said second temperature by a heat transfer means coupled to said substrate holder.]

[3. The method of claim 1 wherein said change in temperature is an insitu process during said first etching step and said second etching step.]

[4. The method of claim 1 wherein said first etching and said second etching are conducted in a substantially constant plasma environment.]

[5. The method of claim 1 wherein said first temperature is higher than said second temperature.]

[6. The method of claim 1 wherein said first temperature is lower than said second temperature.]

[7. The method of claim 1 wherein said first etching comprises radiation.]

[8. The method of claim 1 wherein said second etching comprises radiation.]

[9. The method of claim 1 wherein said first etching is an ion bombardment aided process.]

[10. The method of claim 1 wherein said second etching is an ion bombardment aided process.]

[11. The method of claim 1 wherein said first portion of said film is etched before said second portion of said film.]

[12. The method of claim 1 wherein said second portion of said film is etched before said first portion of said film.]

*13. A method of etching a substrate in the manufacture of a device, the method comprising:*

*placing a substrate having a film thereon on a substrate holder in a chamber, the substrate holder having a selected thermal mass;*

*setting the substrate holder to a selected first substrate holder temperature with a heat transfer device;*

*etching a first portion of the film while the substrate holder is at the selected first substrate holder temperature;*

*with the heat transfer device, changing the substrate holder temperature from the selected first substrate holder temperature to a selected second substrate holder temperature; and*

*etching a second portion of the film while the substrate holder is at the selected second substrate holder temperature;*

*wherein the thermal mass of the substrate holder is selected for a predetermined temperature change within a specific interval of time during processing; the predetermined temperature change comprises the change from the selected first substrate holder temperature to the selected second substrate holder temperature, and the specified time interval comprises the time for changing from the selected first substrate holder temperature to the selected second substrate holder temperature.*

*14. The method of claim 13 wherein the second portion of the film comprises a material composition that is different from the material composition of the first portion of the film.*

*15. The method of claim 13 wherein the change from the first substrate holder temperature to the second substrate holder temperature is an in-situ process during the first portion etching and the second portion etching.*

*16. The method of claim 13 wherein the etching of the first portion of the film and the etching of the second portion of the film are conducted in a substantially constant plasma environment.*

*17. The method of claim 13 wherein etching at least one of the portions of the film comprises radiation.*

*18. The method of claim 13 wherein etching at least one of the portions of the film is an ion bombardment aided process.*

*19. The method of claim 13 wherein:*

*a first substrate etching temperature corresponds to the first substrate holder temperature;*

*a second substrate etching temperature corresponds to the second substrate holder temperature; and*

*the first and the second substrate etching temperatures are in a known relationship to the first and the second substrate holder temperatures.*

*20. The method of claim 19 wherein the first etching temperature is within approximately one degree centigrade of the first substrate holder temperature and the second etching temperature is within approximately one degree centigrade of the second substrate holder temperature.*

*21. The method of claim 13 wherein:*

*a first substrate etching temperature corresponds to the first substrate holder temperature;*

*a second substrate etching temperature corresponds to the second substrate holder temperature;*

*the first substrate etching temperature is higher than the second substrate etching temperature; and*

*the first portion of the film is etched before the second portion of the film.*

*22. The method of claim 13 wherein:*

*a first substrate etching temperature corresponds to the first substrate holder temperature;*

*a second substrate etching temperature corresponds to the second substrate holder temperature;*

*the first substrate etching temperature is lower than the second substrate etching temperature; and*

*the first portion of the film is etched before the second portion of the film.*

*23. The method of claim 13 wherein the substrate holder comprises an electrostatic support chuck having a surface for supporting a substrate in a reaction chamber, the electrostatic support chuck overlays a heat exchange region, and the heat exchange region includes at least one fluid passage through which a fluid can be circulated to heat and/or cool the substrate holder.*

*24. The method of claim 23 wherein the heat exchange region includes at least two separate fluid passages, each fluid passage being configured to have an independent inlet and an independent outlet.*

*25. The method of claim 13 wherein the substrate holder heat transfer device includes a plurality of heating elements.*

*26. The method of claim 25 wherein the heating elements are configured to selectively heat one or more zones of the substrate holder.*

*27. A method of etching a substrate in the manufacture of a device, the method comprising:*

*heating a substrate holder to a first substrate holder temperature with a heat transfer device, the substrate holder having at least one temperature sensing unit,*

*placing a substrate having a film thereon on the substrate holder in a chamber;*

*etching a first portion of the film at a selected first substrate temperature; and*

*etching a second portion of the film at a selected second substrate temperature, the selected second substrate temperature being different from the selected first substrate temperature;*

*wherein substrate temperature is changed from the selected first substrate temperature to the selected second substrate temperature, using a measured substrate temperature, within a preselected time interval for processing, and at least the first substrate temperature or the second substrate temperature, in single or in combination, is above room temperature.*

*28. The method of claim 27 wherein a continuous etching process comprises etching the first portion of the film and etching the second portion of the film.*

*29. The method of claim 27 wherein the substrate temperature change is by at least heat transfer with the substrate using at least an electrostatic chuck.*

*30. The method of claim 27 wherein the substrate temperature change is by transferring heat energy using at least a pressure of gas behind said substrate.*

*31. The method of claim 27 wherein the first substrate temperature is changed to the second substrate temperature by transferring energy using at least radiation.*

*32. The method of claim 27 wherein changing the substrate temperature comprises selectively transferring energy in the form of heat from a substrate temperature control system to the substrate holder.*

*33. The method of claim 27 wherein changing the selected first substrate temperature to the selected second substrate temperature is an in-situ process while etching the first film portion and etching the second film portion.*

*34. The method of claim 27 wherein the second portion of the film comprises a material composition that is different from the material composition of the first portion of the film.*

*35. The method of claim 27 wherein etching at least one portion of the film comprises radiation.*

*36. The method of claim 27 wherein etching at least one portion of the film comprises an ion bombardment aided process.*

*37. A method of processing a substrate during the manufacture of a device, the method comprising:*

*placing a substrate having a film thereon on a substrate holder within a chamber of a plasma discharge apparatus, the plasma discharge apparatus comprising: a substrate temperature control system comprising a substrate temperature sensor and a substrate temperature control circuit operable to adjust the substrate temperature to a predetermined substrate temperature value with a first heat transfer process; and a substrate holder temperature control system comprising a sub-*

*strate holder temperature sensor and a substrate holder temperature control circuit operable to adjust the substrate holder temperature to a predetermined substrate holder temperature value with a second heat transfer process;*

*performing a first film treatment of a first portion of the film at a selected first substrate temperature;*

*with the substrate temperature control circuit, changing from the selected first substrate temperature to a selected second substrate temperature, the selected second substrate temperature being different from the selected first substrate temperature; and*

*performing a second film treatment of a second portion of the film at the selected second substrate temperature;*

*wherein the substrate holder is heated above room temperature during at least one of the first or the second film treatments, and the substrate temperature control circuit is operable to change the substrate temperature from the selected first substrate temperature to the selected second substrate temperature within a preselected time period to process the film.*

*38. The method of claim 37 wherein the substrate temperature control circuit comprises the substrate holder temperature control circuit.*

*39. The method of claim 37 wherein the substrate holder temperature control circuit comprises the substrate temperature control circuit.*

*40. The method of claim 37 wherein at least one film treatment, selected from the first film treatment and the second film treatment, comprises the substrate temperature being less than the substrate holder temperature.*

*41. The method of claim 37 wherein the second portion of the film comprises a material composition that is different from the material composition of the first portion of the film.*

*42. The method of claim 37 wherein at least one film treatment, selected from the first film treatment and the second film treatment, comprises selectively transferring heat energy from the substrate holder to the substrate.*

*43. The method of claim 37 wherein at least one film treatment, selected from the first film treatment and the second film treatment, comprises selectively transferring heat energy from the substrate to the substrate holder.*

*44. The method of claim 37 wherein at least one film treatment, selected from the first film treatment and the second film treatment, comprises maintaining the temperature of the substrate holder above room temperature and selectively transferring heat energy from the substrate into the substrate holder.*

*45. The method of claim 37 wherein at least one film treatment, selected from the first film treatment and the second film treatment, comprises selectively transferring energy in the form of heat to the substrate holder with the substrate temperature control circuit and maintaining the substrate holder temperature above room temperature with the substrate holder control circuit.*

*46. The method of claim 37 wherein at least one film treatment, selected from the first film treatment and the second film treatment, comprises etching.*

*47. The method of claim 37 wherein at least one film treatment, selected from the first film treatment and the second film treatment, comprises chemical vapor deposition.*

*48. The method of claim 37 wherein at least one film treatment comprises maintaining the substrate temperature at a selected value from about 300 to 500 degrees centigrade.*

*49. The method of claim 37 wherein the first temperature is changed to the second temperature by transferring heat using at least a pressure of gas behind the substrate.*

*50. The method of claim 37 wherein the first substrate temperature is changed to the second substrate temperature by transferring energy using at least radiation.*

*51. A method of processing a substrate in the manufacture of a device, the method comprising:*

*placing a substrate having a film thereon on a substrate holder in a processing chamber; the processing chamber comprising the substrate holder, a substrate control circuit operable to adjust the substrate temperature, a substrate holder temperature sensor, and a substrate holder control circuit operable to maintain the substrate holder temperature;*

*performing a first etching of a first portion of the film at a selected first substrate temperature;*

*performing a second etching of a second portion of the film at a selected second substrate temperature, the second temperature being different from the first temperature;*

*wherein at least one of the film portions is etched while heat is being transferred to the substrate holder with the substrate holder control circuit; and*

*the substrate temperature control circuit effectuates the change from the first substrate temperature to the second substrate temperature within a preselected time period.*

*52. The method of claim 51 wherein the etching of at least one of the film portions comprises heat flow from the substrate holder into the substrate.*

*53. The method of claim 51 wherein the etching of at least one of the film portions comprises heat flow from the substrate into the substrate holder.*

*54. The method of claim 51 wherein the etching of at least one of the film portions comprises maintaining the temperature of the substrate in the range of 50° C. to 100° C.*

*55. The method of claim 51 wherein the preselected time period to change from the first substrate temperature to the second substrate temperature subtends less than about 5 percent of a total etching process time.*

*56. A method for processing layers which are included in a stack of layers positioned on a substrate, the method comprising:*

*placing the substrate on a substrate holder;*

*sensing a substrate holder temperature,*

*etching at least a portion of a first silicon-containing layer in a chamber while the substrate is maintained at a selected first substrate temperature; and*

*etching at least a portion of a second silicon-containing layer in the chamber while the substrate is maintained at a selected second substrate temperature;*

*wherein the substrate holder is heated to a temperature operable to maintain at least one of the selected first and the selected second substrate temperatures above 49° C., and the substrate temperature is changed from the first substrate temperature to the second substrate temperature with a control circuit operable to effectuate the changing within a preselected time period that is less than the overall process time associated with the etching the first silicon-containing layer and the second silicon-containing layer.*

*57. The method of claim 56 wherein the change from the first substrate temperature to the second substrate temperature occurs within less than about 5 percent of the total etching process time.*

*58. The method of claim 56 wherein at least one layer is etched in a chlorine-containing ambient.*

*59. The method of claim 56 wherein at least one silicon-containing layer is etched in a chlorine-containing ambient;*

*the first layer is a polysilicon layer, the second layer is a silicide layer and the stack includes an oxide layer;*

*the second substrate temperature is higher than the first substrate temperature; and*

*a portion of at least one layer is selectively etched relative to the oxide layer.*

*60. A method for manufacturing a device comprising an integrated circuit, the method comprising:*

*transferring a substrate comprising a stack of layers including a silicide layer into a chamber, the chamber comprising a substrate holder;*

*sensing the substrate holder temperature;*

*heating the substrate holder with a substrate holder control circuit and a heating device to maintain the substrate holder at a temperature that is operable to effectuate a substrate temperature above room temperature while processing the substrate;*

*processing the substrate on the substrate holder at a first substrate temperature; and*

*processing the substrate on the substrate holder at a second substrate temperature to etch at least a portion of the silicide layer;*

*wherein the first substrate temperature is different from the second substrate temperature and the first substrate temperature is changed to the second substrate temperature with a substrate temperature control circuit within a preselected time to etch the silicide layer.*

*61. The method of claim 60 wherein the first substrate temperature is changed to the second substrate temperature within a selected period of time by at least heat transfer to the substrate using at least an electrostatic chuck.*

*62. The method of claim 60 wherein the first substrate temperature is changed to the second substrate temperature by transferring heat using at least a pressure of gas behind the substrate.*

*63. The method of claim 60 wherein the first substrate temperature is changed to the second substrate temperature by transferring energy using at least radiation.*

*64. The method of claim 13 wherein the change from the first substrate holder temperature to the second substrate holder temperature is effectuated with a control circuit.*

*65. The method of claim 13 wherein the substrate holder reaches the second substrate holder temperature at approximately a selected time.*

*66. The method of claim 27 wherein the first substrate holder temperature is above room temperature.*

*67. The method of claim 37 wherein at least one film treatment comprises transferring energy from the substrate holder with a heat transfer device.*

*68. The method of claim 51 wherein the second portion of the film comprises a material composition different from the first portion of the film.*

*69. The method of claim 51 wherein the substrate temperature is the second substrate temperature at approximately a selected time.*

*70. The method of claim 60 comprising processing the substrate while maintaining the substrate temperature at a selected value within 180 to 220 degrees centigrade.*

*71. The method of claim 60 comprising processing the substrate while maintaining the substrate temperature at a selected value within 50 to 100 degrees centigrade.*

* * * * *